United States Patent
Lim et al.

(10) Patent No.: US 10,838,536 B2
(45) Date of Patent: Nov. 17, 2020

(54) METHOD AND APPARATUS FOR MULTI-SENSING

(71) Applicants: Samsung Display Co., Ltd., Yongin-si (KR); UNIST (ULSAN NATIONAL INSTITUTE OF SCIENCE AND TECHNOLOGY), Ulsan (KR)

(72) Inventors: Jaeik Lim, Hwaseong-si (KR); Wonsang Park, Yongin-si (KR); Hyeyong Chu, Hwaseong-si (KR); Kibog Park, Ulsan (KR); Sungchul Jung, Ulsan (KR); Hanbyul Jin, Pohang-si (KR)

(73) Assignees: Samsung Display Co., Ltd., Yongin-si (KR); UNIST (ULSAN National Institute of Science and Technology), Ulsan (KR)

( * ) Notice: Subject to any disclaimer, the term of this patent is extended or adjusted under 35 U.S.C. 154(b) by 0 days.

(21) Appl. No.: 15/378,991

(22) Filed: Dec. 14, 2016

(65) Prior Publication Data
US 2017/0277341 A1    Sep. 28, 2017

(30) Foreign Application Priority Data

Mar. 23, 2016   (KR) .................. 10-2016-0034812

(51) Int. Cl.
*G06F 3/041*    (2006.01)
*G06F 3/044*    (2006.01)
(Continued)

(52) U.S. Cl.
CPC ............ *G06F 3/0416* (2013.01); *G06F 3/044* (2013.01); *H01L 27/323* (2013.01);
(Continued)

(58) Field of Classification Search
CPC .................. G06F 3/014; G06F 3/044
See application file for complete search history.

(56) References Cited

U.S. PATENT DOCUMENTS 8,451,011 B2    5/2013   Hayakawa et al.
9,075,491 B2    7/2015   Hotelling et al.
(Continued)

FOREIGN PATENT DOCUMENTS

KR       10-1013037       2/2011

OTHER PUBLICATIONS

Yao et al., "Wearable multifunctional sensors using printed stretchable conductors made of silver nanowires," Nanoscale, Dec. 5, 2013, pp. 2345-2352, vol. 6, No. 4, The Royal Society of Chemistry.
(Continued)

*Primary Examiner* — Hang Lin
(74) *Attorney, Agent, or Firm* — H.C. Park & Associates, PLC

(57) ABSTRACT

An electronic device includes a sensor configured to sense a touch event in association with the electronic device or a deformation in a physical shape of the electronic device. The sensor includes a first sensor electrode, a second sensor electrode, and a third sensor electrode. The first sensor electrode extends in a first direction. The second sensor electrode extends in a second direction different from the first direction. The second sensor electrode overlaps with the first sensor electrode in a third direction perpendicular to the first direction and the second direction. The third sensor electrode extends in a fourth direction different from the second direction. The third sensor electrode overlaps with the second sensor electrode in the third direction. The first sensor electrode, the second sensor electrode, and the third sensor electrode are insulated from one another and are disposed on different layers than one another.

13 Claims, 35 Drawing Sheets

(51) Int. Cl.
*H01L 27/32* (2006.01)
*H01L 51/52* (2006.01)
*H01L 51/00* (2006.01)

(52) U.S. Cl.
CPC .............. *G06F 2203/04101* (2013.01); *G06F 2203/04102* (2013.01); *G06F 2203/04111* (2013.01); *H01L 51/0097* (2013.01); *H01L 51/5253* (2013.01)

(56) References Cited

U.S. PATENT DOCUMENTS

| | | | |
|---|---|---|---|
| 9,083,344 B2 | 7/2015 | Kang et al. | |
| 2007/0001584 A1* | 1/2007 | Lee | H01L 27/3211 313/500 |
| 2009/0015270 A1* | 1/2009 | Hayakawa | G01L 1/142 324/686 |
| 2013/0207935 A1* | 8/2013 | Toda | G06F 3/0418 345/174 |
| 2013/0314623 A1* | 11/2013 | Tun | G06F 3/044 349/12 |
| 2014/0062934 A1* | 3/2014 | Coulson | G06F 3/044 345/174 |
| 2014/0110239 A1* | 4/2014 | Lee | G06F 3/044 200/600 |
| 2014/0176465 A1* | 6/2014 | Ma | G02F 1/134309 345/173 |
| 2014/0191771 A1 | 7/2014 | Nam et al. | |
| 2015/0002448 A1* | 1/2015 | Brunet | G06F 3/0416 345/174 |
| 2015/0070306 A1* | 3/2015 | Shinkai | G06F 1/1626 345/174 |
| 2015/0116608 A1 | 4/2015 | Jeong | |
| 2015/0160754 A1* | 6/2015 | Wenzel | G06F 3/044 345/174 |
| 2015/0169091 A1 | 6/2015 | Ho et al. | |
| 2015/0185942 A1* | 7/2015 | Kim | G06F 3/0412 345/173 |
| 2015/0296062 A1* | 10/2015 | Lee | G02F 1/133345 455/566 |
| 2015/0309634 A1* | 10/2015 | Lee | G06F 3/0412 345/173 |
| 2015/0378474 A1* | 12/2015 | Liu | G06F 3/0412 345/174 |
| 2016/0018845 A1* | 1/2016 | Kwak | G06F 1/16 345/173 |

OTHER PUBLICATIONS

Lipomi et al., "Skin-like pressure and strain sensors based on transparent elastic films of carbon nanotubes," Nature Nanotechnology, Dec. 2011, pp. 788-92, vol. 6, No. 12, Macmillan Publishers Limited.

* cited by examiner

FIG. 7
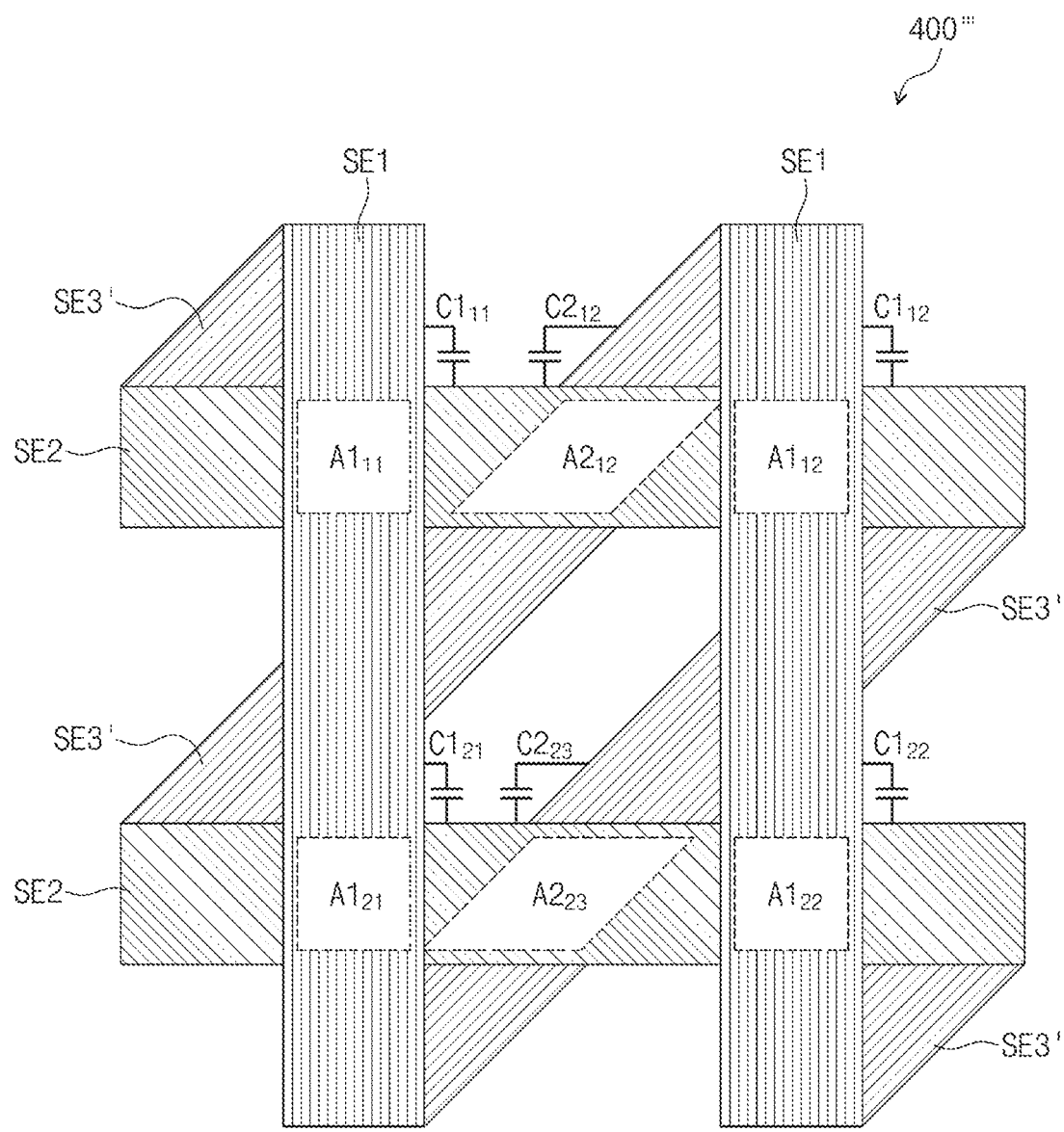
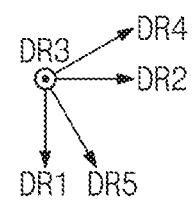

FIG. 20

| Mode | Direction | ΔC1 | ΔC2 | CMP |
|---|---|---|---|---|
| Curve Sensing | Concave | $\Delta C1 > 0$ | $\Delta C2 > 0$ | $\Delta C2 - \Delta C1 > 0$ |
| | Convex | $\Delta C1 > 0$ | $\Delta C2 > 0$ | $\Delta C2 - \Delta C1 < 0$ |
| Pressure Sensing | Upper side | $\Delta C1 > 0$ | $\Delta C2 \approx 0$ | $\Delta C2 - \Delta C1 < 0$ |
| | Lower side | $\Delta C1 \approx 0$ | $\Delta C2 > 0$ | $\Delta C2 - \Delta C1 > 0$ |
| Touch Sensing | Upper side | $\Delta C1 < 0$ | $\Delta C2 < 0$ | $|\Delta C2| - |\Delta C1| < 0$ |
| | Lower side | $\Delta C1 < 0$ | $\Delta C2 < 0$ | $|\Delta C2| - |\Delta C1| > 0$ |
| Stretch Sensing | Uniaxial | $\Delta C1 > 0$ | $\Delta C2 > 0$ | $\Delta C2 - \Delta C1 \approx 0$ |
| Compression Sensing | Uniaxial | $\Delta C1 < 0$ | $\Delta C2 < 0$ | $|\Delta C2| - |\Delta C1| \approx 0$ |

FIG. 27
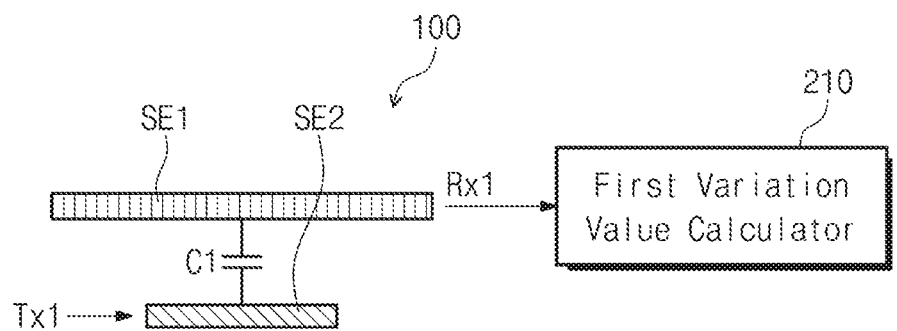
<First Sensing Period>
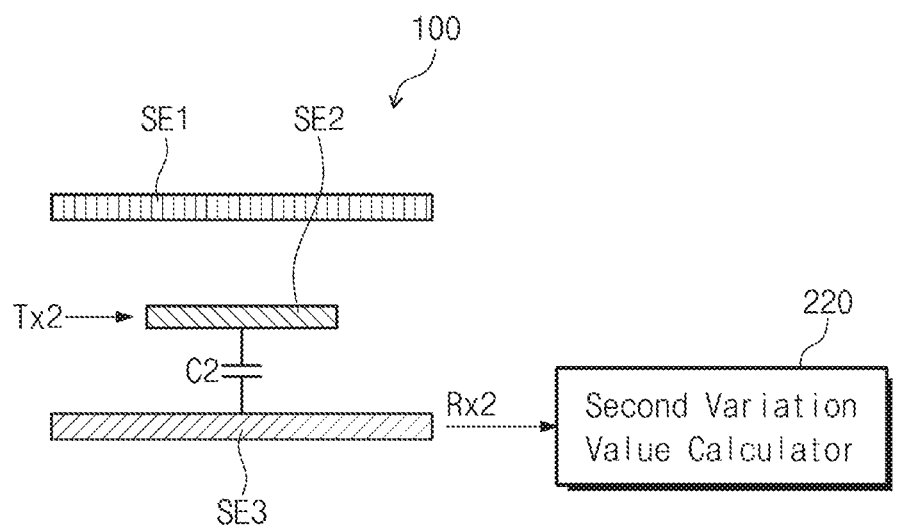
<Second Sensing Period>

FIG. 28
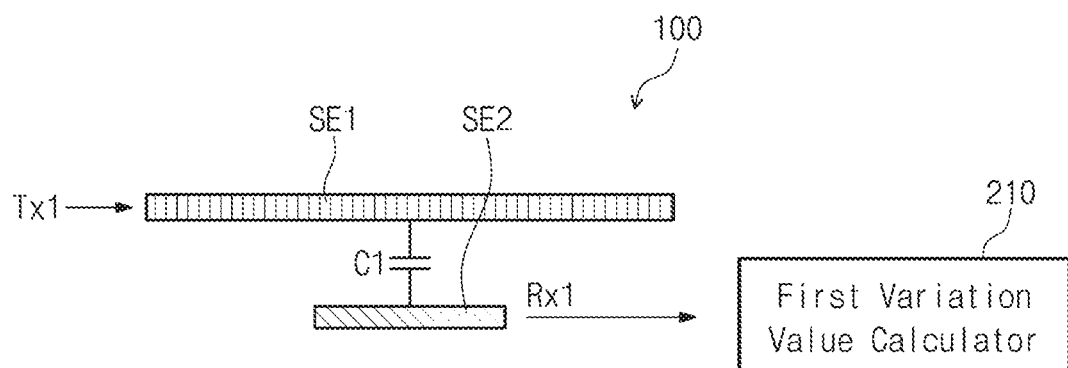
<First Sensing Period>
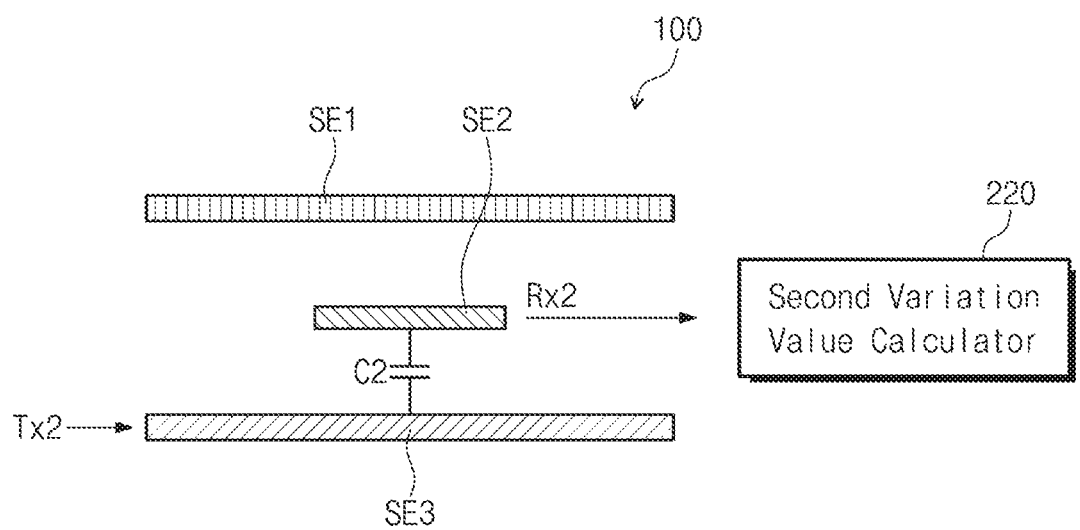
<Second Sensing Period>

FIG. 29
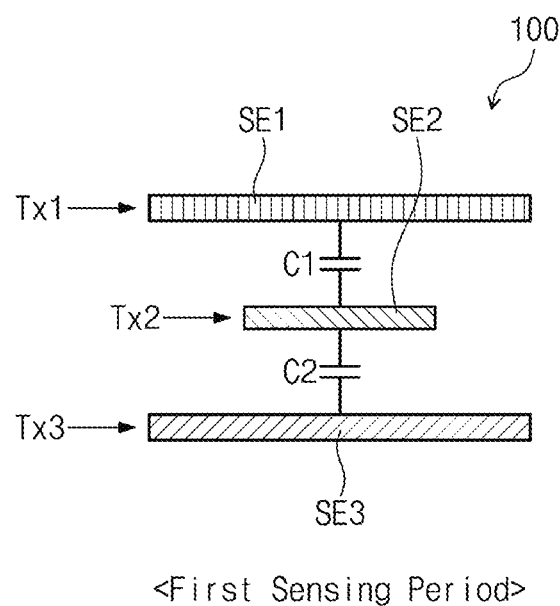
<First Sensing Period>
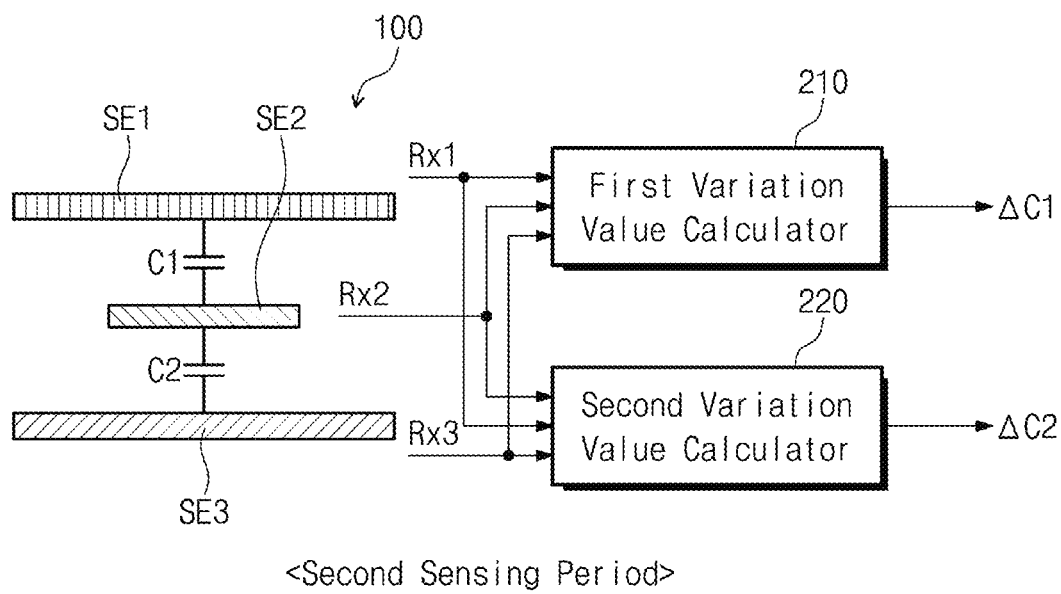
<Second Sensing Period>

METHOD AND APPARATUS FOR MULTI-SENSING

CROSS-REFERENCE TO RELATED APPLICATION

This application claims priority from and the benefit of Korean Patent Application No. 10-2016-0034812, filed on Mar. 23, 2016, which is hereby incorporated by reference for all purposes as if fully set forth herein.

BACKGROUND

Field

The present disclosure relates to a method and apparatus, and, more particularly, to a method and apparatus configured to provide a multi-sensing function.

Discussion of the Background

A flexible electronic device may be formed of various flexible materials enabling the device to be intentionally bent, compressed, rolled, stretched, twisted, and/or the like. The flexible electronic device may also include one or more sensors, such as one or more touch sensors, one or more pressure sensors, etc. Typically, these sensors are only configured to detect a particular type (or mode) of interaction with the flexible electronic device. This may not only increase manufacturing cost and complexity, but also increase the dimensions and weight of the flexible electronic device, which may negatively impact ergonomics and aesthetic appeal.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide an apparatus including a sensor configured to perform a multi-sensing function.

One or more exemplary embodiments provide a method of multi-sensing.

Additional aspects will be set forth in the detailed description which follows, and, in part, will be apparent from the disclosure, or may be learned by practice of the inventive concept.

According to one or more exemplary embodiments, an electronic device includes a sensor configured to sense a touch event in association with the electronic device or a deformation in a physical shape of the electronic device. The sensor includes a first sensor electrode, a second sensor electrode, and a third sensor electrode. The first sensor electrode extends in a first direction. The second sensor electrode extends in a second direction different from the first direction. The second sensor electrode overlaps with the first sensor electrode in a third direction perpendicular to the first direction and the second direction. The third sensor electrode extends in a fourth direction different from the second direction. The third sensor electrode overlaps with the second sensor electrode in the third direction. The first sensor electrode, the second sensor electrode, and the third sensor electrode are insulated from one another and are disposed on different layers than one another.

According to one or more exemplary embodiments, an electronic device includes a sensor and at least one processor. The sensor includes: a first sensor electrode; a second sensor electrode disposed on the first sensor electrode; and a third sensor electrode disposed on the second sensor electrode. The at least one processor is configured to: determine a variation in value of a first capacitance formed between the first sensor electrode and the second sensor electrode as a first variation value; determine a second variation in value of a second capacitance formed between the second sensor electrode and the third sensor electrode as a second variation value; and determine a deformation of the sensor based on the first variation value and the second variation value.

According to one or more exemplary embodiments, a method includes: determining a first variation in capacitance with respect to a first capacitance formed in association with a first surface of a first sensing electrode of an electronic device; determining a second variation in capacitance with respect to a second capacitance formed in association with a second surface of the first sensing electrode, the second surface opposing the first surface; and determining a mode of user interaction with the electronic device among modes of user interaction based on the first variation, the second variation, and a comparison of the first variation and the second variation.

According to one or more exemplary embodiments, an apparatus includes: a flexible shell, a stack of flexible sensing electrodes, and at least one processor. The stack of flexible sensing electrodes is disposed on the flexible shell. The stack of flexible sensing electrodes includes a first sensing electrode disposed between a second sensing electrode and a third sensing electrode. The at least one processor is configured to receive, in response to a deformation of the flexible shell, sensing signals from the stack of flexible sensing electrodes. The sensing signals include: a first sensing signal corresponding to a first variation in capacitance between the first sensing electrode and the second sensing electrode, and a second sensing signal corresponding to a second variation in capacitance between the first sensing electrode and the third sensing electrode. The at least one processor is further configured to determine a type and a direction of the deformation based on the first variation, the second variation, and a comparison of the first variation and the second variation.

According to one or more exemplary embodiments, an apparatus includes: a first grid of sensing electrodes disposed amongst a first pair of overlapping planes; a second grid of sensing electrodes disposed amongst a second pair of overlapping planes, the second pair of overlapping planes sharing a common plane with the first pair of overlapping planes; and at least one processor. The at least one processor is configured to: receive, in response to deformation of the apparatus, first sensing signals corresponding to first variations in capacitances formed between overlapping portions of the sensing electrodes of the first grid; receive, in response to the deformation, second sensing signals corresponding to second variations in capacitances formed between overlapping portions of the sensing electrodes of the second grid; and determine three-dimensional spatial information corresponding to a surface of the apparatus based on the first variations, the second variations, and comparisons between the first variations and the second variations.

According to one or more exemplary embodiments, an electronic device may sense deformation of a sensor and a touch event based on input from first to third sensor electrodes stacked on one another and first and second capacitances formed between at least some of the first to third electrodes. In this manner, a structure of a sensor may be simplified, and an electronic device including the sensor may perform a multi-sensing function using the simplified sensor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 7 is a plan view of a sensor, according to one or more exemplary embodiments.

FIG. 20 is a table of modes of a sensing processor, according to one or more exemplary embodiments.

FIG. 27 is a cross-sectional view of a sensor, according to one or more exemplary embodiments.

FIG. 28 is a cross-sectional view of a sensor, according to one or more exemplary embodiments.

FIG. 29 is a cross-sectional view of a sensor, according to one or more exemplary embodiments.

DETAILED DESCRIPTION OF THE ILLUSTRATED EMBODIMENTS

Figure 1:
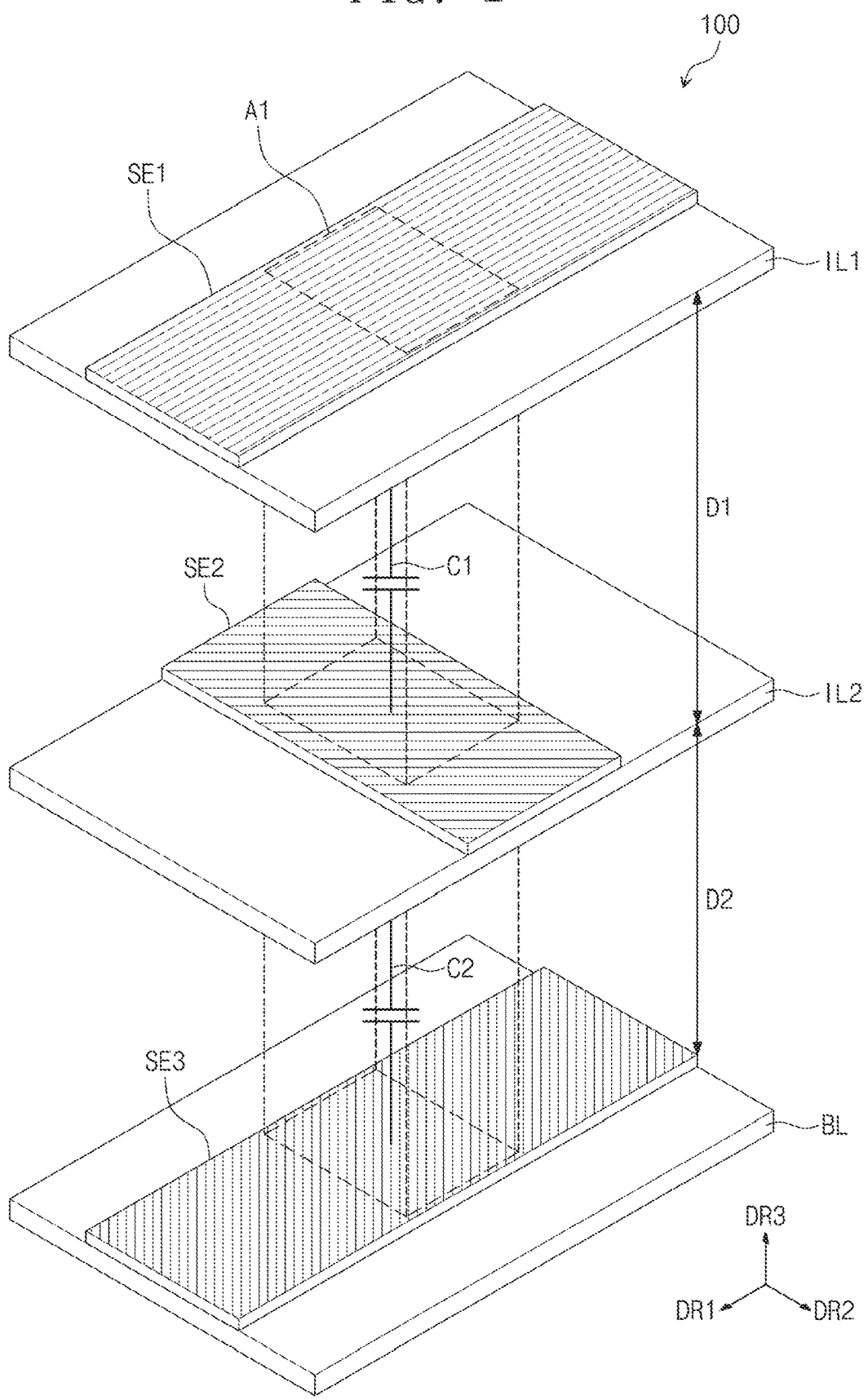
FIG. 1 is an enlarged perspective view of a portion of a sensor, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is an enlarged perspective view of a portion of a sensor, according to one or more exemplary embodiments.

Referring to FIG. 1, a sensor 100 includes a first sensor electrode SE1, a second sensor electrode SE2, a third sensor electrode SE3, a first insulating layer IL1, a second insulating layer IL2, and a base layer BL. Although specific reference will be made to this particular implementation, it is also contemplated that the sensor 100 may embody many forms and include multiple and/or alternative components.

The first to third sensor electrodes SE1 to SE3 are disposed on different layers from each other and insulated from each other. In one or more exemplary embodiments, the third sensor electrode SE3 is disposed on the base layer BL, the second sensor electrode SE2 is disposed on the third sensor electrode SE3, and the first sensor electrode SE1 is disposed on the second sensor electrode SE1. In this manner, the second sensor electrode SE2 is disposed between the first sensor electrode and the third sensor electrode SE3. The first insulating layer IL1 is disposed between the first and second sensor electrodes SE1 and SE2 to insulate the first and second sensor electrodes SE1 and SE2 from each other. The second insulating layer IL2 is disposed between the second and third sensor electrodes SE2 and SE3 to insulate the second and third sensor electrodes SE2 and SE3 from each other.

According to one or more exemplary embodiments, each of the first and third sensor electrodes SE1 and SE3 extends (e.g., longitudinally extends) in a first direction DR1, and the second sensor electrode SE extends (e.g., longitudinally extends) in a second direction DR2 crossing the first direction DR1. The second direction DR2 may be, for example, perpendicular to the first direction DR1, but exemplary embodiments are not limited thereto or thereby. For instance, the first and second directions DR1 and DR2 may not be perpendicular to each other, and the third sensor electrode SE3 may extend in a direction different from the first and second directions DR1 and DR2, as will become more apparent below.

At least some portions of the first to third sensor electrodes SE1 to SE3 overlap with each other in a vertical direction. The vertical direction is vertical to the directions in which the first to third sensor electrodes SE1 to SE3 extend. As seen in FIG. 1, the vertical direction may be vertical (e.g., perpendicular) to the first and second directions DR1 to DR2, and, as such, may be referred to as a third direction DR3. For example, the first to third sensor electrodes SE1 to SE3 may overlap with each other in a first area A1 defined on the first sensor electrode SE1 when viewed in the third direction DR3, e.g., when viewed in a plan view. The first area A1 may be projected onto the second and third electrodes SE2 and SE3 according to the dashed lines illustrated in FIG. 1. A first dimension (e.g., width) in the first direction DR1 of the first area A1 may be, for example, less than or equal to a corresponding dimension (e.g., width) in the first direction DR1 of each of the first to third sensor electrodes SE1 to SE3. In one or more exemplary embodiments, each of the first to third sensor electrodes SE1 to SE3 has a rectangular shape when viewed in the third direction DR3. The first to third sensor electrodes SE1 to SE3 may have the same (or substantially the same) first dimension (e.g., width) in the first direction DR1 as each other.

According to one or more exemplary embodiments, the first and third sensor electrodes SE1 and SE3 entirely overlap with each other. In other words, the first and third sensor electrodes SE1 and SE3 are disposed at substantially the same position and have substantially the same area as each other. Exemplary embodiments, however, are not limited thereto or thereby.

As seen in FIG. 1, each of the first to third sensor electrodes SE1 to SE3 may include a conductive material. For example, each of the first to third sensor electrodes SE1 to SE3 may be, but is not limited to, a transmissive electrode, a transflective electrode, or a non-transmissive electrode (or a reflective electrode). In addition, each of the first to third sensor electrodes SE1 to SE3 may be formed as a single-layer structure of a single material or plural materials different from each other, or formed as a multilayer structure of plural materials, which may be different from each other. For instance, each of the first to third electrodes SE1 to SE3 may be a transmissive electrode or a transflective electrode, each of the first to third electrodes SE1 to SE3 may include a layer of lithium (Li), calcium (Ca), lithium fluoride (LiF)/Ca, LiF/aluminum (Al), Al, magnesium (Mg), barium fluoride (BaF), Ba, silver (Ag), molybdenum (Mo), titanium (Ti), a compound thereof, a mixture thereof (e.g., a mixture of Ag and Mg), or a transparent metal oxide, e.g., indium tin oxide (ITO), indium zinc oxide (IZO), zinc oxide (ZnO), indium tin zinc oxide (ITZO), which is optically thin. When each of the first to third electrodes SE1 to SE3 is a reflective electrode, each of the first, second, and third electrodes SE1, SE2, and SE3 may include a layer of Ag, Mg, Al, platinum (Pt), palladium (Pd), gold (Au), nickel (Ni), neodymium (Nd), iridium (Ir), chromium (Cr), Li, Ca, LiF/Ca, LiF/Al, Mo, Ti, a compound thereof, or a mixture thereof (e.g., a mixture of Ag and Mg).

According to one or more exemplary embodiments, each of the first and second insulating layers IL1 and IL2 has a single-layer structure or a multi-layer structure of an organic material and/or an inorganic material. Each of the first and second insulating layers IL1 and IL2 has an elasticity. The first and second insulating layers IL1 and IL2 may be flexed, e.g., bent, compressed, rolled, stretched, twisted, etc., by an external force.

A first capacitance C1 may be defined between the first and second sensor electrodes SE1 and SE2, and a second capacitance C2 may be defined between the second and third sensor electrodes SE2 and SE3. The first capacitance C1 is determined according to a first electrode distance D1 between the first and second sensor electrodes SE1 and SE2 in the third direction DR3, and the second capacitance C2 is determined according to a second electrode distance D2 between the second and third sensor electrodes SE2 and SE3 in the third direction DR3.

When a touch event occurs on (or in association with) the sensor 100 by an external object (e.g., appendage, stylus, etc.), the first and second capacitances C1 and C2 vary depending on a capacitance formed between the object and the sensor 100. In addition, when the sensor 100 is physically deformed by an external force applied to the sensor 100, the first and second electrode distances D1 and D2 change, and, as such, the first and second capacitances C1 and C2 vary. The sensor 100 may sense the touch event and/or the deformation of the sensor 100 simultaneously or at different times.

Figure 2:
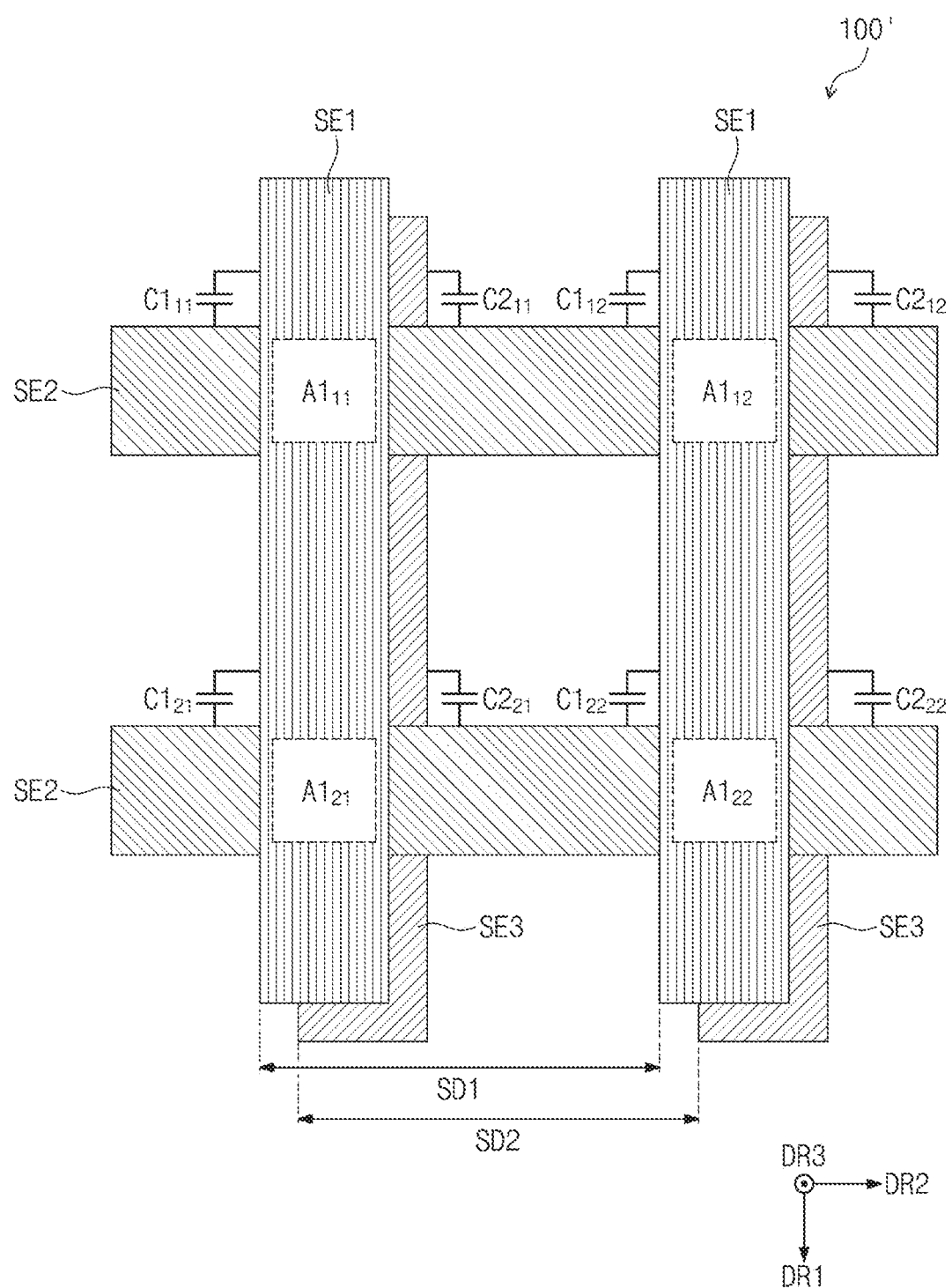
FIG. 2 is a plan view of a sensor, according to one or more exemplary embodiments.

FIG. 2 is a plan view of a sensor, according to one or more exemplary embodiments.

Referring to FIG. 2, sensor 100' includes each of the first to third sensor electrodes SE1 to SE3 in plural. As seen in FIG. 2, each of the first to third sensor electrodes SE1 to SE3 is provided as two corresponding sensor electrodes. It is contemplated, however, that exemplary embodiments are not limited thereto or thereby.

The first sensor electrodes SE1 extend in the first direction DR1 and are arranged in the second direction DR2 to be spaced apart from each other. The second sensor electrodes SE2 extend in the second direction DR2 and are arranged in the first direction DR1 to be spaced apart from each other. The third sensor electrodes SE3 extend in the first direction DR1 and are arranged in the second direction DR2 to be spaced apart from each other. As previously mentioned, the third sensor electrodes SE3 are entirely overlapped with the first sensor electrodes SE1 in the third direction DR3; however, for descriptive and illustrative convenience, the third sensor electrodes SE3 are shown as not completely overlapping with portions of the first sensor electrodes SE1. In this manner, a first distance SD1 in the second direction DR2 between the first sensor electrodes SE1 may be the same (or substantially the same) as a second distance SD2 in the second direction DR2 between the third sensor electrodes SE3.

According to one or more exemplary embodiments, the first area A1 shown in FIG. 1 may be provided in plural. That is, a first area A1$(m, n)$ in which an m-th second sensor electrode SE2 is overlapped with an n-th first sensor electrode SE1 is referred to as a first area A1$_{mn}$. For instance, an area in which a first, second sensor electrode SE2 is overlapped with a first, first sensor electrode SE1 may be referred to as a first area A1$_{11}$.

The first and second capacitances C1 and C2 shown in FIG. 1 may be provided in plural. That is, an (m, n)-th first capacitance $C1_{mn}$ may be the first capacitance C1 defined between the m-th second sensor electrode SE2 and the n-th first sensor electrode SE1, and an (m, n)-th second capacitance $C2_{nm}$ may be the second capacitance C2 defined between the m-th second sensor electrode SE2 and an n-th third sensor electrode SE3. The first and second capacitances $C1_{11}$ to $C1_{22}$ and $C2_{11}$ to $C2_{22}$ shown in FIG. 2 may be defined in correspondence with the first areas $A1_{11}$ to $A1_{22}$. For instance, the (1, 1)-th first and second capacitances $C1_{11}$ and $C2_{11}$ are defined according to the (1, 1)-th first area $A1_{11}$.

According to one or more exemplary embodiments, the configuration and/or deformation of the first to third sensor electrodes SE1 to SE3 is not limited to or by the above-noted features and/or conditions. In this manner, the first to third sensor electrodes SE1 to SE3 may be configured and/or deformed in various manners so long as the first to third sensor electrodes SE1 to SE3 overlap with each other and define the first and second capacitances $C1_{mn}$ and $C2_{mn}$.

Figure 3:
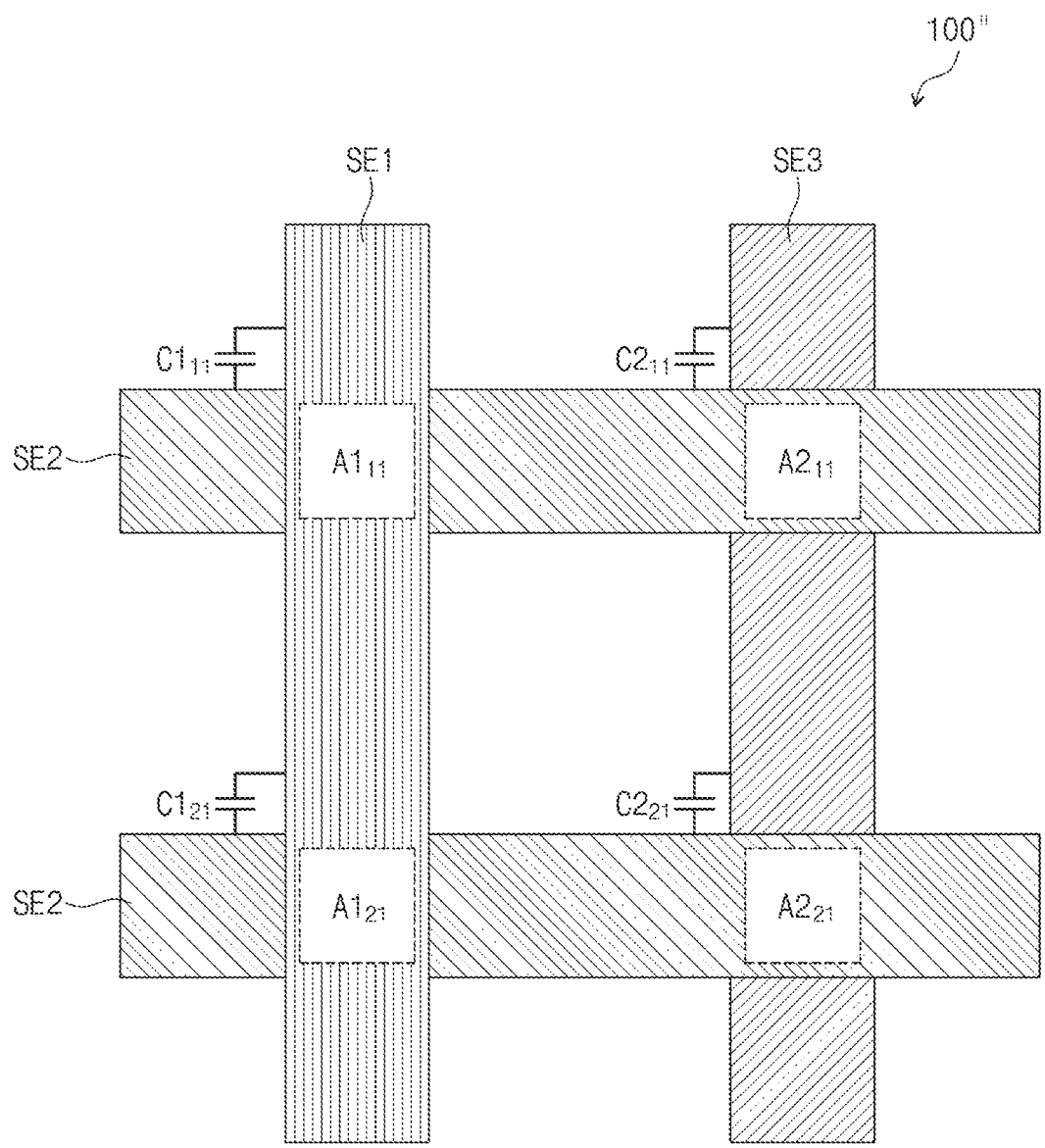
FIG. 3 is a plan view of a sensor, according to one or more exemplary embodiments.

FIG. 3 is a plan view of a sensor, according to one or more exemplary embodiments. Sensor 100" of FIG. 3 is similar to sensor 100' of FIG. 2, and, as such, duplicative descriptions have been omitted to avoid obscuring exemplary embodiments described herein.

Referring to FIG. 3, sensor 100" includes the first sensor electrodes SE1 spaced apart from the third sensor electrodes SE3 in the second direction DR2. In other words, the first sensor electrodes SE1 may not overlap with the third sensor electrodes SE3 in the third direction DR3. For example, the first and third sensor electrodes SE1 and SE3 may be alternately arranged with each other in the second direction DR2. The first sensor electrodes SE1 may be arranged in odd columns, and the third sensor electrodes SE3 may be arranged in even columns. In this manner, the first sensor electrodes SE1 overlap with the second sensor electrodes SE2 in the third direction DR3 in the odd columns, and the third sensor electrodes SE3 overlap with the second sensor electrodes SE2 in the third direction DR3 in the even columns.

According to one or more exemplary embodiments, an area in which the m-th second sensor electrode SE2 overlaps with an n-th third sensor electrode SE3 may be referred to as a second area $A2_{mn}$. The (m, n)-th second area $A2_{mn}$ may be defined on the m-th second sensor electrode SE2 and projected onto the n-th third sensor electrode E3. In one or more exemplary embodiments, the second and third sensor electrodes SE2 and SE3 overlap with each other in (1, 1)-th and (2, 1)-th second areas $A2_{11}$ and $A2_{21}$ in the third direction DR3. As shown in FIG. 3, the second areas $A2_{12}$ and $A2_{22}$ are defined in the even columns and spaced apart from the first areas $A1_{11}$ and $A1_{21}$ in the second direction DR2.

The first capacitance C1 shown in FIG. 1 may be provided in plural. For instance, (1, 1)-th and (2, 1)-th first capacitances $C1_{11}$ and $C1_{21}$ are defined in correspondence with the (1, 1)-th and (2, 1)-th first areas $A1_{11}$ and $A1_{21}$. The second capacitance C2 shown in FIG. 1 may be provided in plural. For instance, (1, 1)-th and (2, 1)-th second capacitances $C2_{11}$ and $C2_{21}$ are defined in correspondence with the (1, 1)-th and (2, 1)-th second areas $A2_{11}$ and $A2_{21}$.

Figure 4:
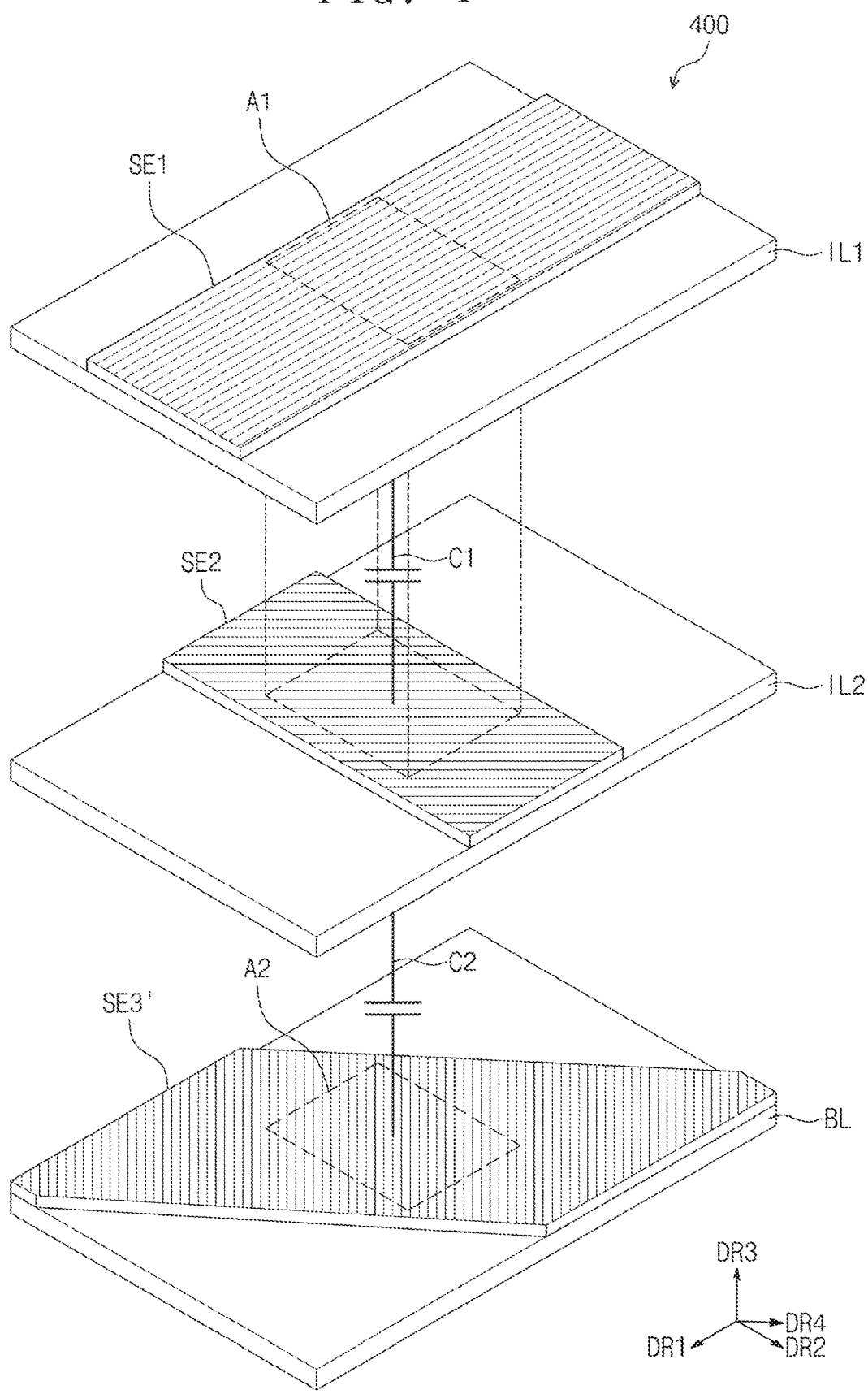
FIG. 4 is an enlarged perspective view of a portion of a sensor, according to one or more exemplary embodiments.

FIG. 4 is an enlarged perspective view of a portion of a sensor, according to one or more exemplary embodiments. Sensor 400 of FIG. 4 is similar in structure and function as the sensor 100 of FIG. 1, and, as such, duplicative descriptions have been omitted to avoid obscuring exemplary embodiments described herein. In this manner, the differences in the features associated with third sensor electrode SE3' will be described below.

Referring to FIG. 4, the third sensor electrode SE3' may extend in a fourth direction DR4 crossing the first to third directions DR1 to DR3. For instance, the fourth direction DR4 may be vertical (e.g., perpendicular) to the third direction DR3 and different from the first and second directions DR1 and DR2. The fourth direction DR4 form angles of about 135 degrees and about 45 degrees with respect to the first and second directions DR1 and DR2, respectively. In this manner, the second sensor electrode SE2 may overlap with the third sensor electrode SE3' in a second area A2 defined on the third sensor electrode SE3' when viewed in the third direction DR3. The second area A2 may have a shape reflecting the differences in longitudinal directions of extension of the second sensor electrode SE2 and the third sensor electrode SE3'. Although not illustrated, the sensor area A2 may be projected onto the second sensor electrode SE2.

Figure 5:
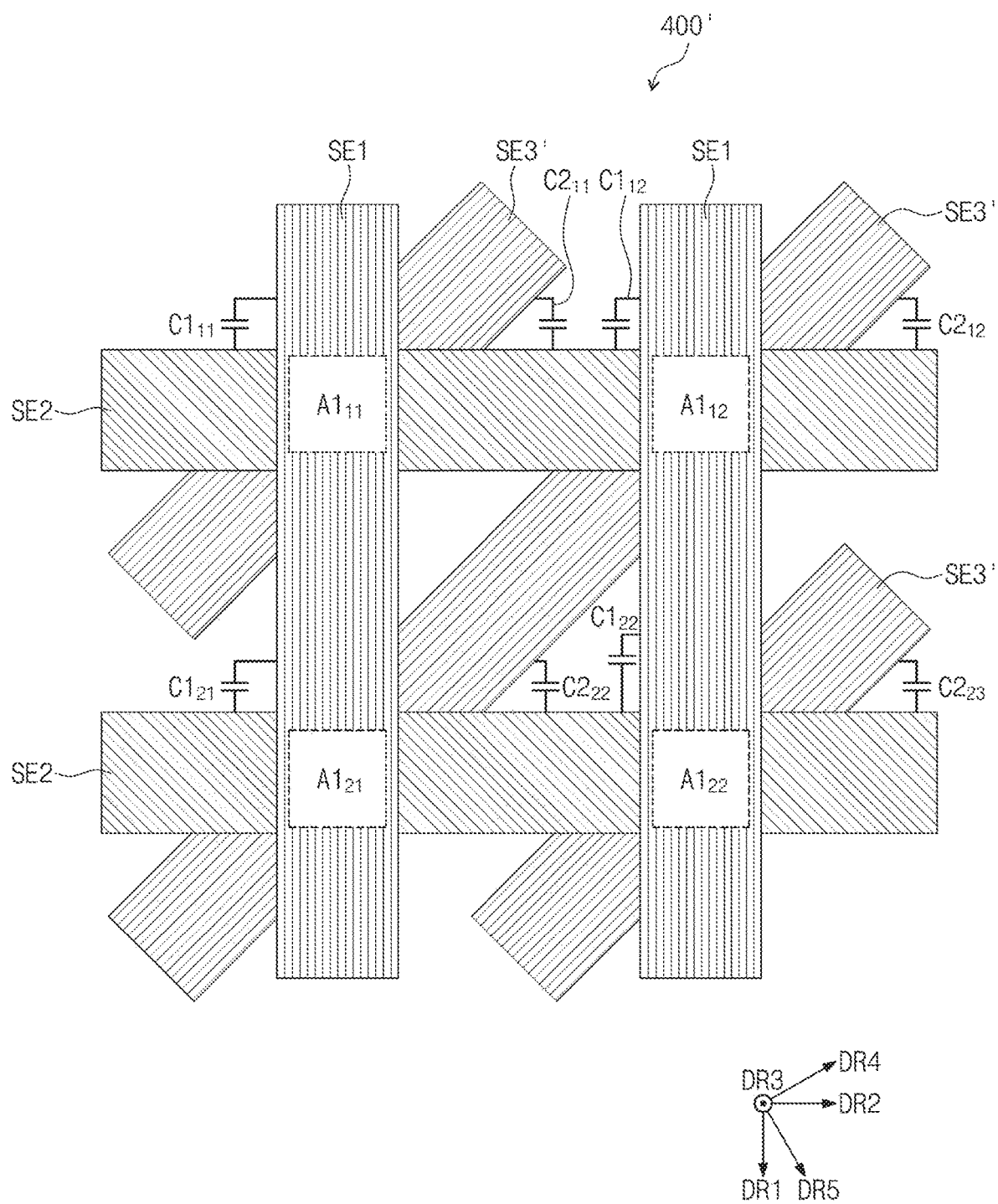
FIG. 5 is a plan view of a sensor, according to one or more exemplary embodiments.

FIG. 5 is a plan view of a sensor, according to one or more exemplary embodiments. Sensor 400' of FIG. 5 is similar in structure and function as the sensors 100 and 400 of FIGS. 1 and 4, respectively, and, as such, duplicative descriptions have been omitted to avoid obscuring exemplary embodiments described herein. In this manner, different features associated with the third sensor electrode SE3' will be described below. Also, for illustrative convenience, the (1, 1)-th, (1, 2)-th, (2, 2)-th, and (2, 3)-th second areas $A2_{11}$, $A2_{12}$, $A2_{22}$, and $A2_{23}$ are not illustrated, but disposed below the (1, 1)-th, (1, 2)-th, (2, 1)-th, and (2, 2)-th first areas $A1_{11}$, $A1_{12}$, $A1_{21}$, and $A1_{22}$.

As seen in FIG. 5, the third sensor electrodes SE3' extend in the fourth direction DR4 and are arranged in a fifth direction DR5 to be spaced apart from each other. The fifth direction DR5 crosses the first to fourth directions DR1 to DR4. For instance, the fifth direction DR5 may be vertical (e.g., perpendicular) to the third direction DR3 and different from the first, second, and fourth directions DR1, DR2, and DR4. The fifth direction DR5 may be, for example, vertical (e.g., perpendicular) to the fourth direction DR4. Furthermore, the (1, 1)-th to (2, 2)-th first capacitances $C1_{11}$ to $C1_{22}$ and (1, 1)-th, (1, 2)-th, (2, 2)-th, and (2, 3)-th second capacitances $C2_{11}$, $C2_{12}$, $C2_{22}$, and $C2_{23}$ may be defined between the first, second, and third sensor electrodes SE1, SE2, and SE3'.

Figure 6:
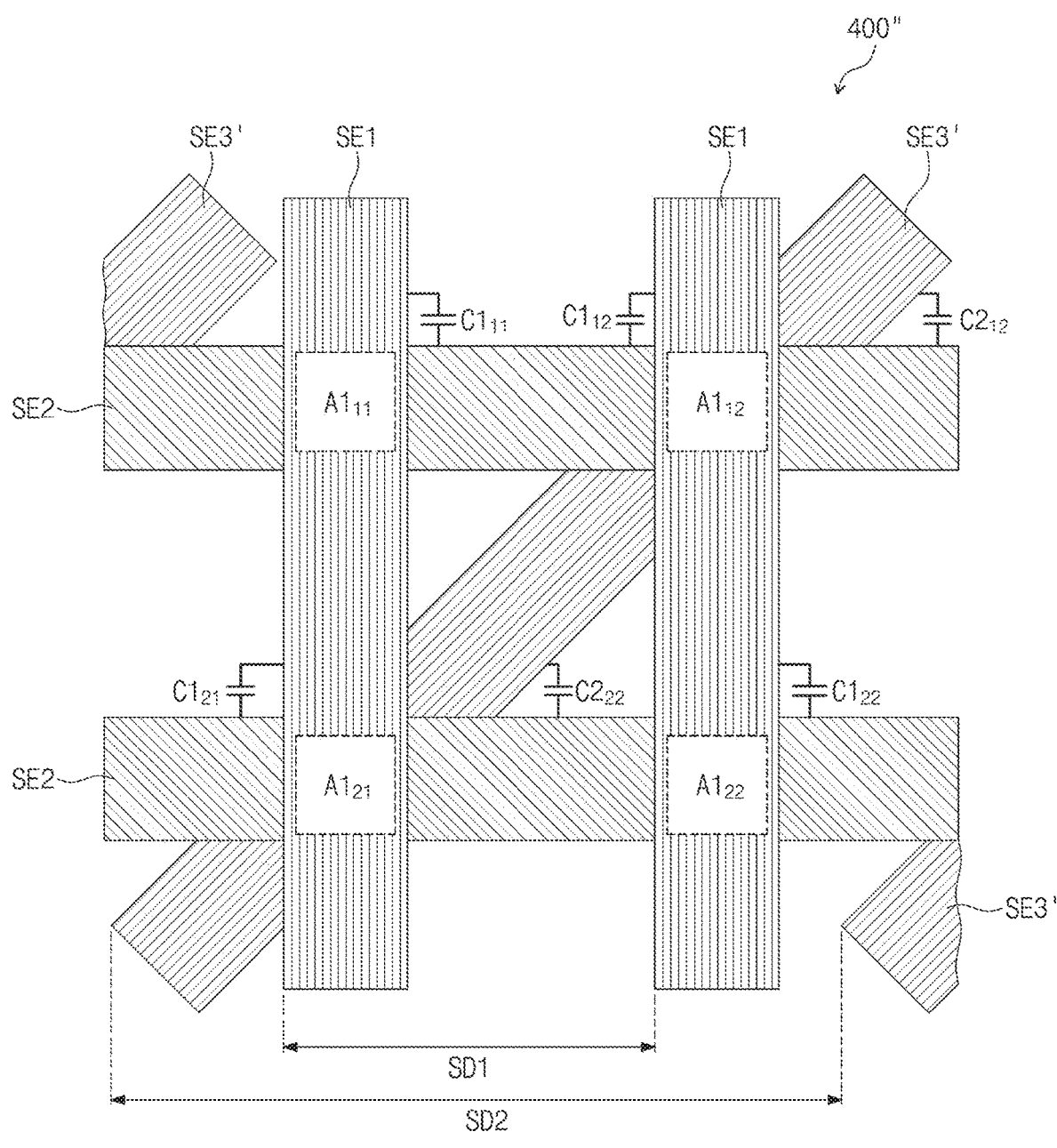
FIG. 6 is a plan view of a sensor, according to one or more exemplary embodiments.

FIG. 6 is a plan view of a sensor, according to one or more exemplary embodiments. Sensor 400" of FIG. 6 is similar in structure and function as the sensors 100, 400, and 400' of FIGS. 1, 4, and 5, and, as such, duplicative descriptions have been omitted to avoid obscuring exemplary embodiments described herein. In this manner, different features associated with the third sensor electrode SE3' will be described below.

Referring to FIG. 6, the second distance SD2 between adjacent third electrodes SE3' may be different from the first distance SD1 between adjacent first electrodes SE1. The second distance SD2 may be, for example, greater than the first distance SD1. In one or more exemplary embodiments, the second distance SD2 may be two times greater than the first distance SD1. For example, the third sensor electrodes SE3' may not overlap with the second sensor electrode SE2 in the (1, 1)-th first area $A1_{11}$ and (2, 2)-th first area $A1_{22}$ when viewed in the third direction DR3, but the third sensor electrodes SE3' may overlap with the second sensor electrode SE2 in the (1, 2)-th first area $A1_{12}$ and (2, 1)-th first area $A1_{21}$ when viewed in the third direction DR3. The (1, 2)-th and (2, 2)-th second capacitances $C2_{12}$ and $C2_{22}$ are defined between the second and third sensor electrodes SE2 and SE3'.

FIG. 7 is a plan view showing a sensor, according to one or more exemplary embodiments. Sensor 400''' of FIG. 7 is similar in structure and function as the sensors 100, 400, 400', and 400'' of FIGS. 1 and 4 to 6, and, as such, duplicative descriptions have been omitted to avoid obscuring exemplary embodiments described herein. In this manner, different features associated with the third sensor electrode SE3' will be described below.

Referring to FIG. 7, the second and third sensor electrodes SE2 and SE3' overlap with each other in the (1, 2)-th and (2, 3)-th second areas $A2_{12}$ and $A2_{23}$ when viewed in the third direction DR3. The (1, 2)-th and (2, 3)-th second areas $A2_{12}$ and $A2_{23}$ are defined in even column instances and are spaced apart from the first areas $A1_{11}$, $A1_{12}$, $A1_{21}$, and $A1_{22}$ in the second direction DR2. In this manner, the (1, 2)-th and (2, 3)-th second areas $A2_{12}$ and $A2_{23}$ are disposed between the first areas $A1_{11}$, $A1_{12}$, $A1_{21}$, and $A1_{22}$. Accordingly, the third sensor electrodes SE3' may not overlap with the second sensor electrodes SE2 in the first areas $A1_{11}$, $A1_{12}$, $A1_{21}$, and $A1_{22}$ when viewed in the third direction DR3. The third sensor electrodes SE3' may overlap with the second sensor electrodes SE2 in the (1, 2)-th and (2, 3)-th second areas $A2_{12}$ and $A2_{23}$ when viewed in the third direction DR3. As such, the (1, 2)-th and (2, 3)-th second capacitances $C2_{12}$ and $C2_{23}$ may be defined between the second and third electrodes SE2 and SE3'. Although not illustrated in FIG. 7, the spacing between adjacent third sensing electrodes SE3' in FIG. 7 may be less than the spacing (e.g., second distance SD2) between adjacent third sensing electrodes SE3' in FIG. 6.

Figure 8:
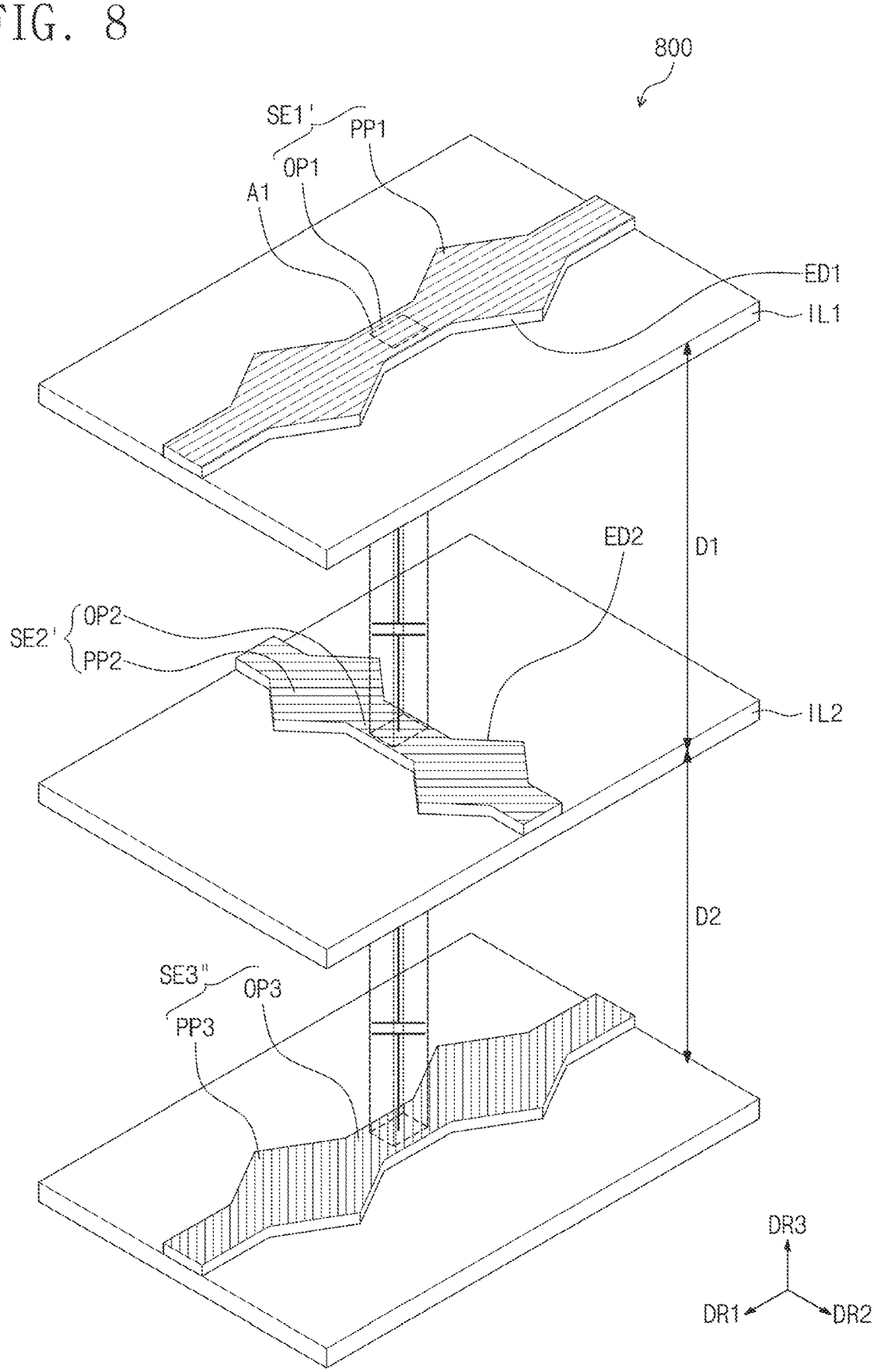
FIG. 8 is an enlarged perspective view of a portion of a sensor, according to one or more exemplary embodiments.
Figure 9:
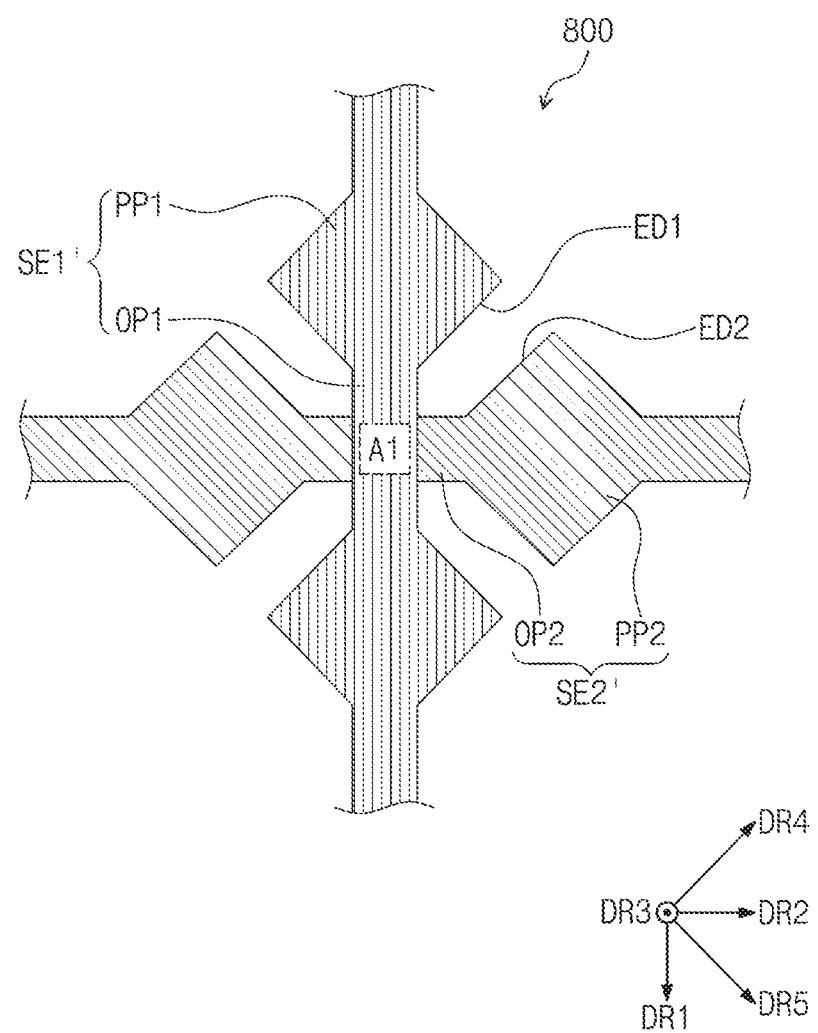
FIG. 9 is a plan view of the portion of the sensor of FIG. 8, according to one or more exemplary embodiments.

FIG. 8 is an enlarged perspective view of a portion of a sensor, according to one or more exemplary embodiments. FIG. 9 is a plan view of the portion of the sensor of FIG. 8, according to one or more exemplary embodiments. Sensor 800 of FIGS. 8 and 9 is similar in structure and function as the sensor 100 of FIGS. 1, and 5, and, as such, duplicative descriptions have been omitted to avoid obscuring exemplary embodiments described herein. In this manner, different features associated with the shape of the first, second, and third sensor electrodes SE1', SE2', and SE3'' will be described below.

Referring to FIGS. 8 and 9, the first sensor electrode SE1' includes a first overlap portion OP1 and a first pattern portion PP1 extending in the first direction DR1 from the first overlap portion OP1. The first pattern portion PP1 has a lozenge shape and includes a first edge ED1 inclined with respect to the first and second directions DR1 and DR2 when viewed in a plan view, e.g., when viewed in the third direction DR3. The first edge ED1 may be, for example, parallel to the fourth and fifth directions DR4 and DR5.

In one or more exemplary embodiments, the second sensor electrode SE2' includes a second overlap portion OP2 and a second pattern portion PP2 extending in the second direction DR2 from the second overlap portion OP2. The second pattern portion PP2 does not overlap with the first pattern portion PP1 in the third direction DR3. The second pattern portion PP2, however, has a lozenge shape and includes a second edge ED2 inclined with respect to the first and second directions DR1 and DR2 when viewed in a plan view, e.g., when viewed in the third direction DR3. The second edge ED2 may be, for example, parallel to the fourth and fifth directions DR4 and DR5. The first and second overlap portions OP1 and OP2 overlap with each other in the first area A1 when viewed in the third direction DR3. The first and second edges ED1 and ED2 may face each other and may be parallel to each other when viewed in a plan view. The first and second edges ED1 and ED2 are spaced apart from each other.

The third sensor electrode SE3 includes a third overlap portion OP3 and a third pattern portion PP3 extending in the first direction DR1 from the third overlap portion OP3. The third pattern portion PP3 may have substantially the same shape as the first pattern portion PP1 when viewed in a plan view. To this end, the third pattern portion PP3 may overlap with the first pattern portion PP1 in the third direction DR3.

Figure 10:
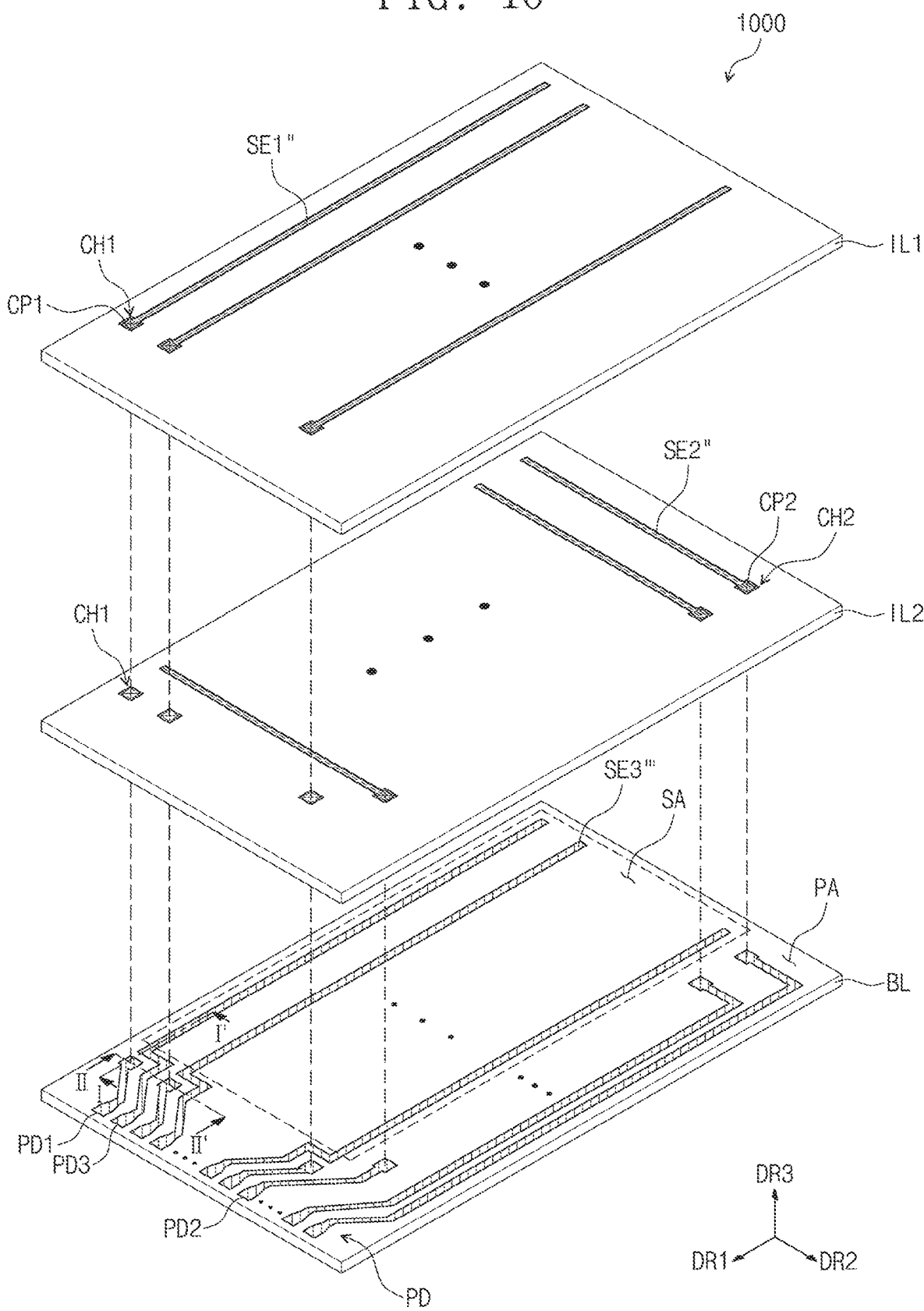
FIG. 10 is a perspective view of a sensor, according to one or more exemplary embodiments.

FIG. 10 is a perspective view of a sensor, according to one or more exemplary embodiments. Sensor 1000 of FIG. 10 is similar in configuration and function as the sensor of FIG. 1, and, as such, duplicative descriptions have been omitted to avoid obscuring exemplary embodiments described herein. In this manner, differences are described below.

Referring to FIG. 10, the sensor 1000 further includes a plurality of pads PD disposed on the base layer BL. In one or more exemplary embodiments, the pads PD are arranged in a pad area PA disposed outside (e.g., surrounding) a sensing area SA. The pads PD transmit a sensor signal. The sensor signal may be a driving signal, such as a detecting signal (also referred to as a "Tx" signal) applied to the first, second, and third sensor electrodes SE1'', SE2'', and SE3''' from a processing device (e.g., controller, processor, etc.) disposed outside or inside the sensor 1000 to drive the first, second, and third sensor electrodes SE1'', SE2'', and SE3''', or a sensing signal (also referred to as a "Rx" signal) sensed by the first, second, and third sensor electrodes SE1'', SE2'', and SE3'''.

According to one or more exemplary embodiments, first ends of first pads PD1 among the pads PD extend to the first sensor electrodes SE1''. A plurality of first contact holes CH1 may be defined through the first and second insulating layers IL1 and IL2 and overlap with the first ends of the first pads PD1 in the third direction DR3. To this end, the sensor 1000 may also include first and second contacts CP1 and CP2. The first contacts CP1 are respectively disposed in the first contact holes CH1. The first contacts CP1 extend from the first sensor electrodes SE1'' and penetrate through the first and second insulating layers IL1 and IL2. The first ends of the first pads PD1 make contact with and are connected to the first contacts CP1. The first contact holes CH1 and the first contacts CP1 are arranged in the second direction DR2.

As seen in FIG. 10, first ends of second pads PD2 among the pads PD extend to the second sensor electrodes SE2''. A plurality of second contact holes CH2 may be defined through the second insulating layer IL2 to overlap with the first ends of the second pads PD2 in the third direction DR3. The second contacts CP2 are respectively disposed in the second contact holes CH2. The second contacts CP2 extend from the second sensor electrodes SE2'' and penetrate through the second insulating layer IL2. The first ends of the second pads PD2 make contact with and are connected to the second contacts CP2. The second contact holes CH2 and the second contact parts CP2 are arranged in the first direction DR1. Among the pads PD, first ends of third pads PD3 extend to the third sensor electrodes SE3''', and, as such, first ends of the third pads PD3 make contact with and are connected to the third sensor electrodes SE3'''.

Figure 11A:
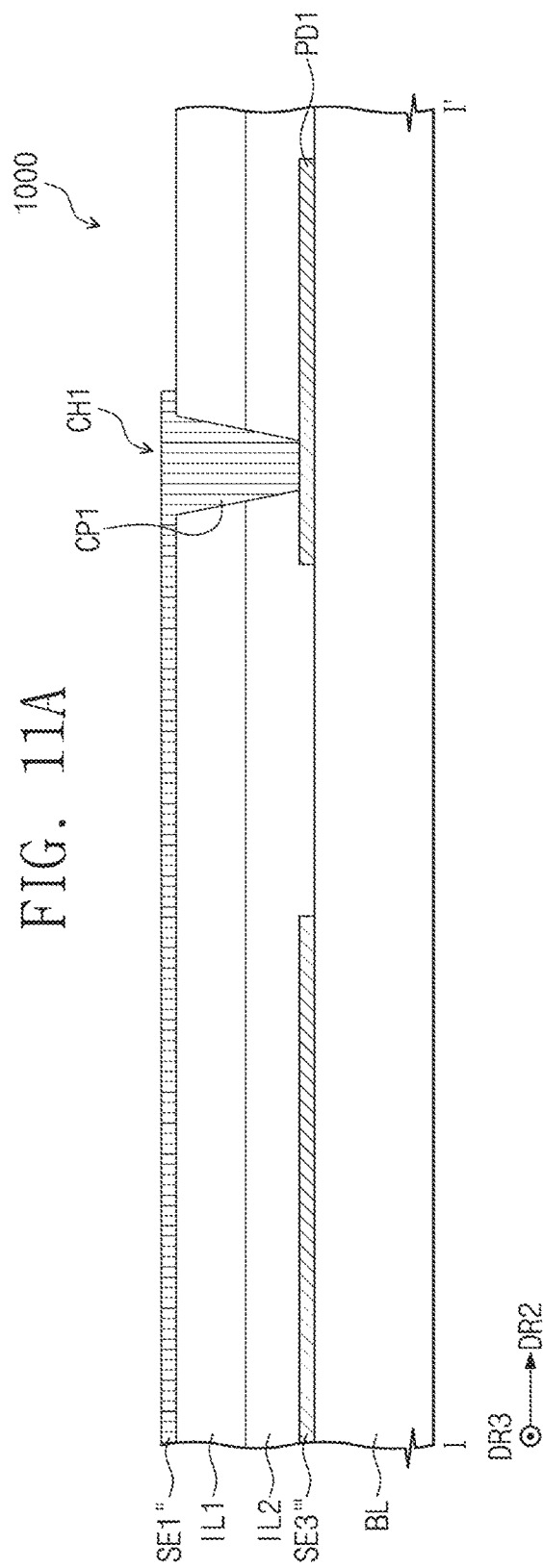
FIG. 11A is a cross-sectional view of the sensor of FIG. 10 taken along sectional line I-I', according to one or more exemplary embodiments.
Figure 11B:
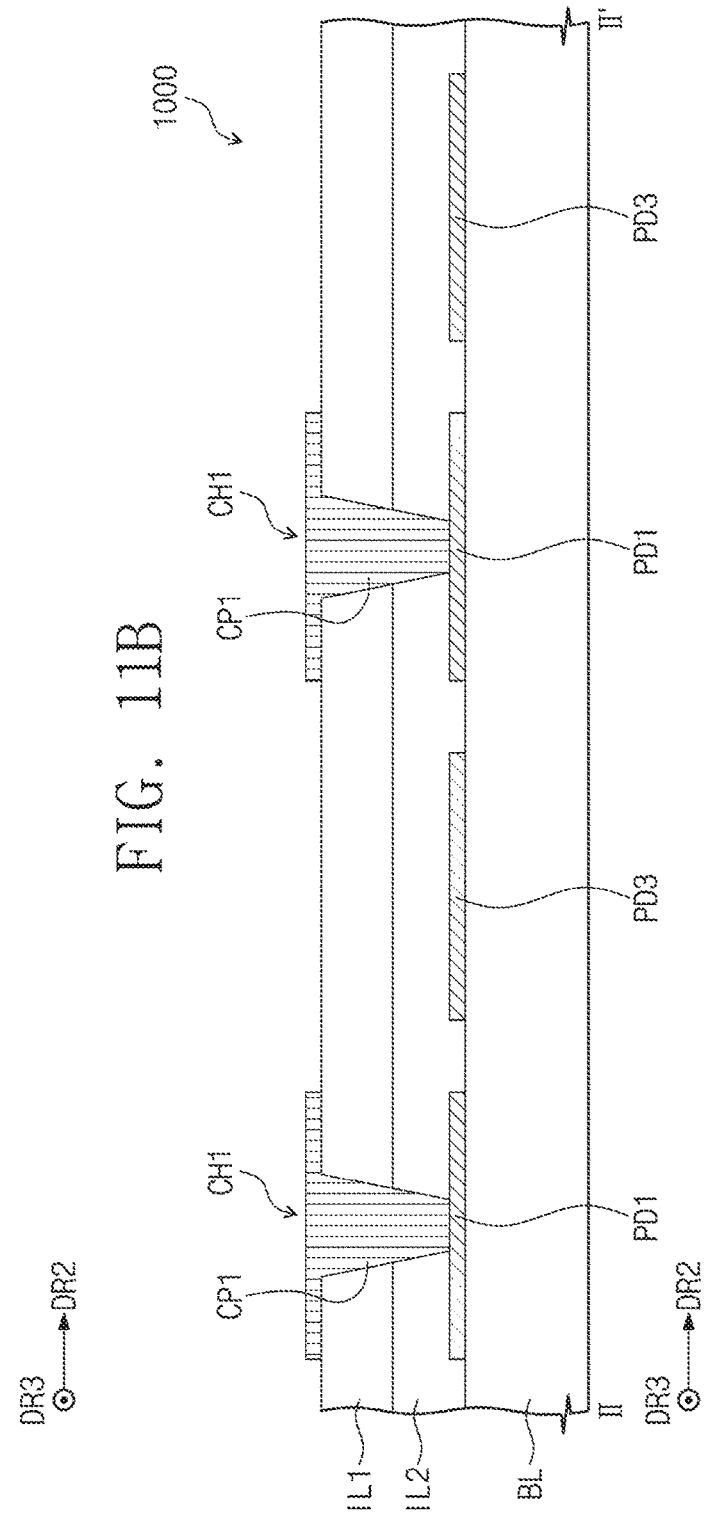
FIG. 11B is a cross-sectional view of the sensor of FIG. 10 taken along sectional line according to one or more exemplary embodiments.

FIG. 11A is a cross-sectional view of the sensor of FIG. 10 taken along sectional line I-I', according to one or more exemplary embodiments. FIG. 11B is a cross-sectional view of the sensor of FIG. 10 taken along sectional line according to one or more exemplary embodiments.

Referring to FIGS. 11A and 11B, the third pads PD3 may be alternately arranged with the first pads PD1 in the second direction DR2. The first ends of the first pads PD1 may overlap with the first ends of the third pads PD3 in the second direction DR2. The first ends of the first pads PD1 may overlap with the first ends of the third sensor electrodes SE3''' in the first direction DR1.

Figure 12:
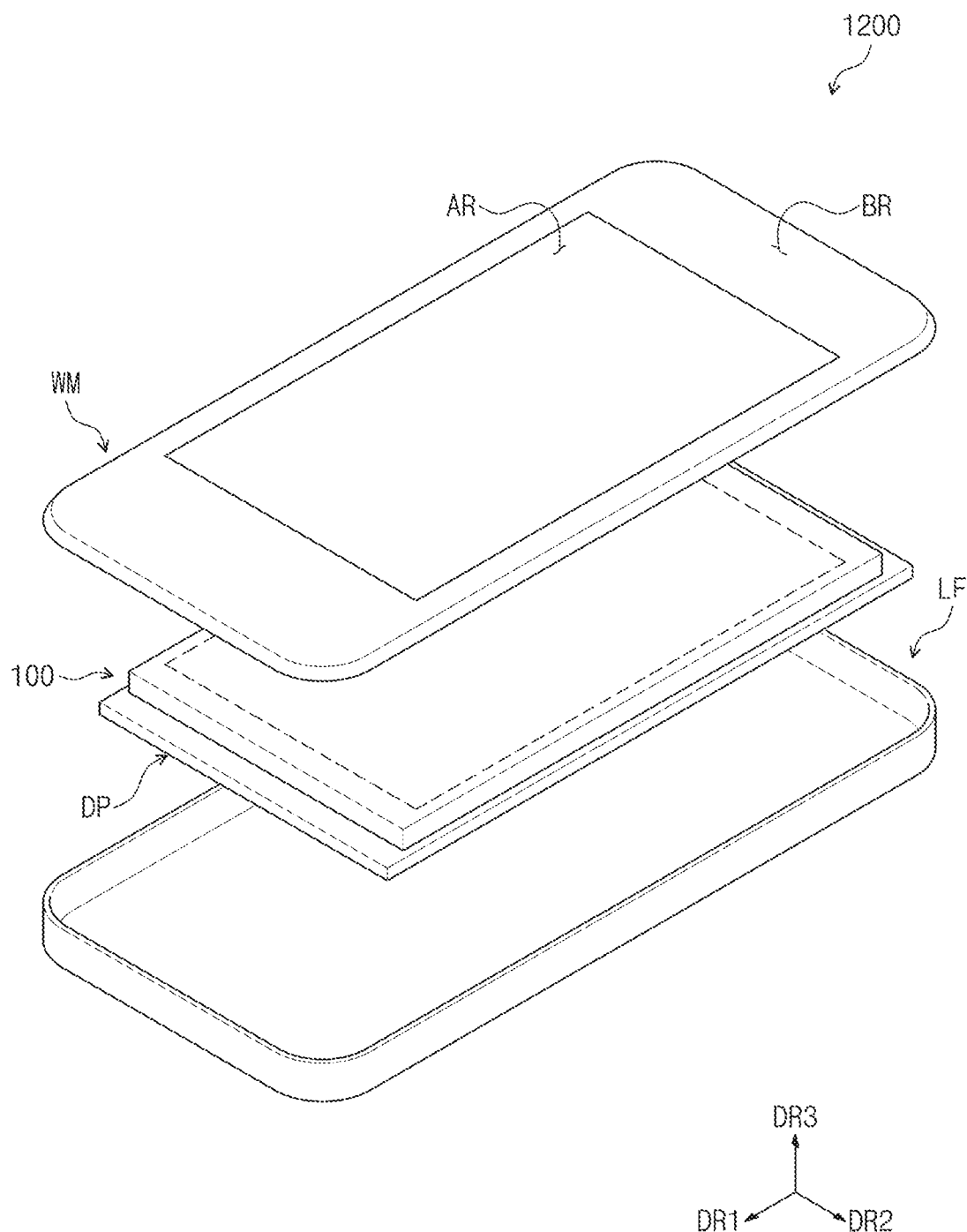
FIG. 12 is an exploded perspective view of an electronic device including a multi-sensing sensor, according to one or more exemplary embodiments.

FIG. 12 is an exploded perspective view of an electronic device including a multi-sensing sensor, according to one or more exemplary embodiments. For convenience, the electronic device 1200 of FIG. 12 is illustrated and described with respect to a display device, however, exemplary embodiments are not limited thereto or thereby.

As shown in FIG. 12, the display device 1200 includes a plurality of areas distinguished from each other on a display surface of the display device 1200. The display device 1200 includes a display area AR through which an image is displayed and a non-display area BR disposed adjacent to the display area AR. As an example, the non-display area BR surrounds the display area AR. According to one or more exemplary embodiments, the display device 1200 includes a window member WM, a lower frame LF, a display part DP, and the sensor 100. For illustrative and descriptive convenience, the sensor is referred to as sensor 100, however, the sensor may refer to at least one of the aforementioned sensors 100, 100', 100'', 400, 400', 400'', 400''', 800, and 1000. Each of the window member WM, the display part DP, and the sensor 100 includes areas respectively corresponding to the display area AR and the non-display area BR.

The lower frame LF is coupled to the window member WM to accommodate the display part DP and the sensor 100. The lower frame LF is formed by assembling plural parts or by an injection molding process forming a single (or unitary) body. The lower frame LF may include a plastic or metal material. In one or more exemplary embodiments, the lower frame LF may be omitted.

According to one or more exemplary embodiments, the sensor 100 and the window member WM are disposed on the display part DP. A black matrix (not shown) may be disposed on a rear surface of the window member WM to define the non-display area BR. The black matrix (not shown) may be formed of a colored organic layer, which may be applied through a coating method. An optically clear adhesive film (OCA) (not illustrated) may be disposed between the sensor 100 and the window member WM. In this manner, the sensor 100 may be attached (or otherwise coupled) to the window member WM by the OCA.

The display part DP displays the image. The display part DP may include, for example, a flat display panel, such as a liquid crystal display panel, an organic light emitting display panel, etc. The lower frame LF is coupled to the window member WM. The lower frame LF defines a space in which the rear surface of the display part DP is accommodated.

In one or more exemplary embodiments, the display device 1200 may be, but is not limited to, a flexible display device. As such, components, e.g., the display part DP, the sensor 100, etc., of the display device 1200 may be formed of materials having flexibility, and, thus, the components, e.g., the display part DP, the sensor 100, etc., of the display device 1200 may be bent, compressed, curved, stretched, twisted, or pressed when an external force is applied to the display device 1200.

Figure 13:
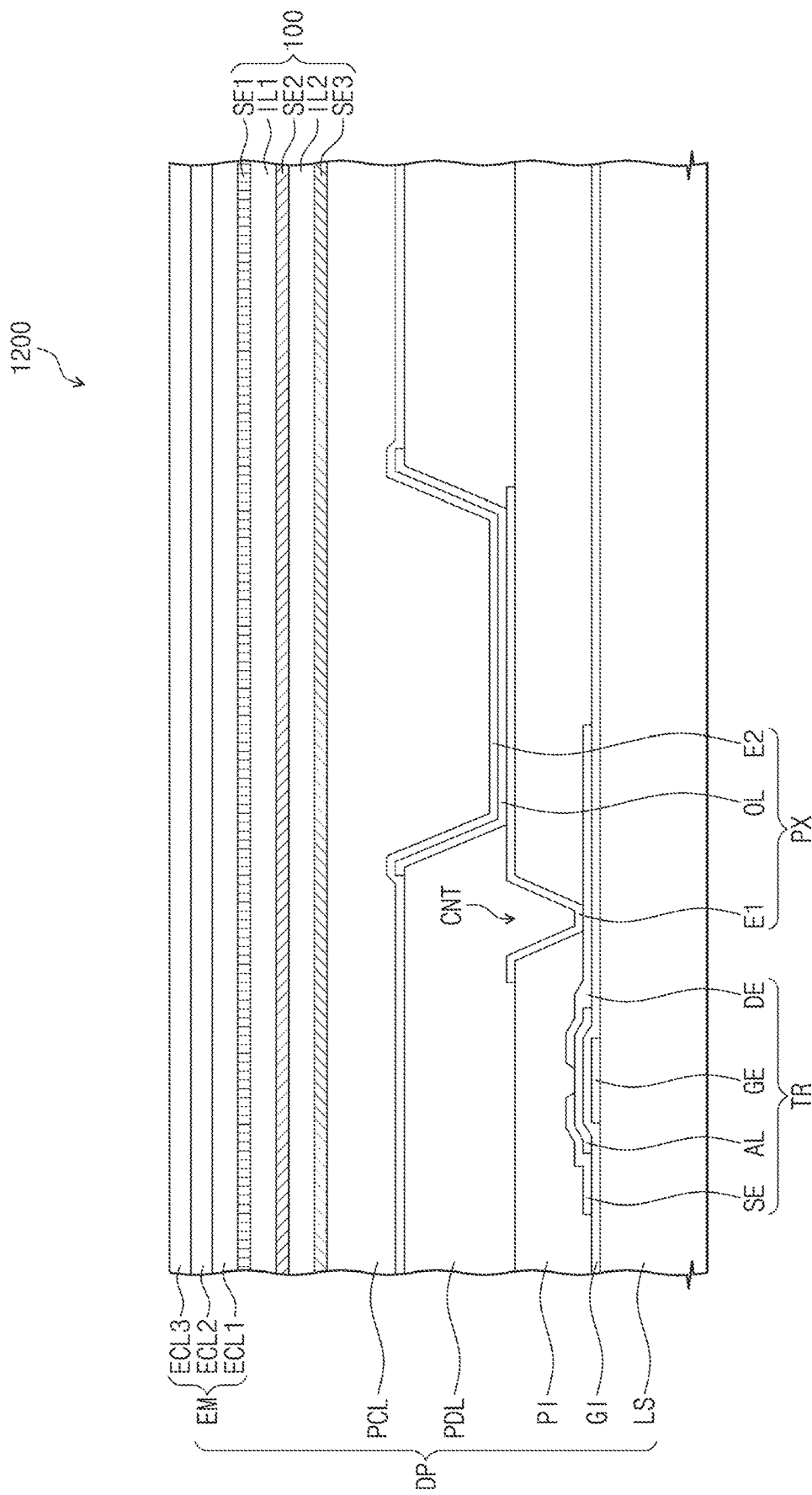
FIG. 13 is a cross-sectional view of the electronic device of FIG. 12, according to one or more exemplary embodiments.

FIG. 13 is a cross-sectional view of the electronic device of FIG. 12, according to one or more exemplary embodiments. As previously mentioned, the electronic device 1200 is described with respect to a display device.

Referring to FIG. 13, the display part DP includes a lower substrate LS, a gate insulating layer GI, a transistor TR, a pixel definition layer PDL, a pixel insulating layer PI, a pixel cover layer PCL, and an encapsulation member EM.

The gate insulating layer GI is disposed on the lower substrate LS and includes a single layer or a multi-layer of an organic material and/or an inorganic material. The transistor TR includes a gate electrode GE, a source electrode SE, a drain electrode DE, and a semiconductor layer AL. The gate electrode GE is covered by the gate insulating layer GI, and the semiconductor layer AL is disposed on the gate insulating layer GI. The source electrode SE connected to one end of the semiconductor layer AL, and the drain electrode DE is spaced apart from the source electrode SE and connected to the other end of the semiconductor layer AL.

The pixel insulating layer PI is disposed on an entire (or substantially entire) surface of the lower substrate LS and covers the transistor TR. The pixel insulating layer PI planarizes upper layers that are formed thereon. An upper surface of the pixel insulating layer PI substantially parallel to an upper surface of the lower substrate LS.

According to one or more exemplary embodiments, the pixel PX includes a first electrode E1, an organic layer OL, and a second electrode E2. The first electrode E1 is disposed on the pixel insulating layer PI. A portion of the first electrode E1 is disposed in a contact hole CNT formed through the pixel insulating layer PI and makes contact with a portion of the drain electrode DE exposed through the contact hole CNT.

The pixel definition layer PDL covers an edge of the first electrode E1 to expose at least a portion of the first electrode E1. The organic layer OL is disposed on a portion of the first electrode E1 and the pixel definition layer PDL. The organic layer OL includes, for example, an organic light emitting layer, an electron transport layer, an electron injection layer, a hole transport layer, and a hole injection layer. The second electrode E2 is disposed on the pixel definition layer PDL and the organic layer OL. Further, the pixel cover layer PCL is disposed on an entire (or substantially entire) surface of the lower substrate LS. The pixel cover layer PCL covers the second electrode E2. The pixel cover layer PCL planarizes upper layers formed thereon, and an upper surface of the pixel cover layer PCL is substantially parallel to an upper surface of the lower substrate LS.

The encapsulation member EM encapsulates the organic layer OL. That is, the encapsulation layer EM prevents (or at least reduces) the potential of the organic layer OL from being exposed to the outside and protects (or at least reduces) the potential of the organic layer OL from being exposed to oxygen, moisture, and other foreign substances. The encapsulation member EM may include, for example, first, second, and third encapsulation layers ECL1, ECL2, and ECL3. The first to third encapsulation layers ECL1 to ECL3 include the organic material and/or the inorganic material. As an example, the encapsulation member EM may include one, or four, or more layers.

According to one or more exemplary embodiments, the sensor 100 may be disposed under the encapsulation member EM. That is, the sensor 100 may be disposed between the encapsulation member EM and the pixel cover layer PCL. As an example, the first sensor electrode SE1 may make contact with a lower surface of the first encapsulation layer ECL1, and the third sensor electrode SE3 may make contact with the pixel cover layer PCL.

Figure 14:
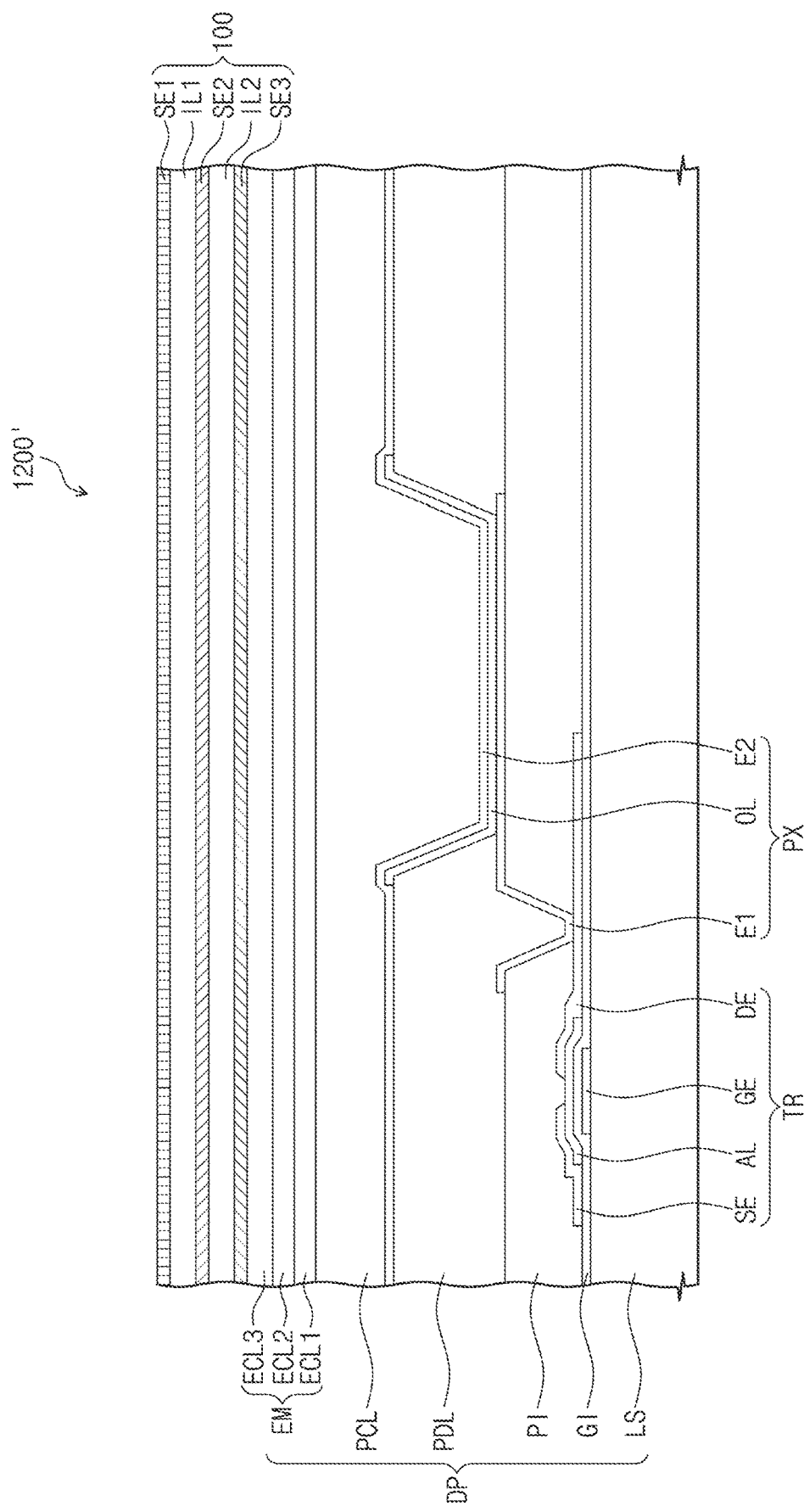
FIG. 14 is a cross-sectional view of an electronic device, according to one or more exemplary embodiments.

FIG. 14 is a cross-sectional view of an electronic device, according to one or more exemplary embodiments. For convenience, the electronic device 1200' of FIG. 14 is illustrated and described with respect to a display device, however, exemplary embodiments are not limited thereto or thereby. The display device 1200' of FIG. 14 is similar in structure and function as the display device 1200 of FIG. 13, and, as such, duplicative descriptions have been omitted to avoid obscuring exemplary embodiments described herein. In this manner, different features associated with a position of sensor 100 will be described below. Further, although the sensor is referred to as sensor 100, it is noted that the sensor may refer to at least one of the previously described sensors 100, 100', 100", 400, 400', 400", 400''', 800, and 1000.

Referring to FIG. 14, the sensor 100 may be disposed on the encapsulation member EM. As an example, the third sensor electrode SE3 may make contact with the third encapsulation layer ECL3.

Figure 15:
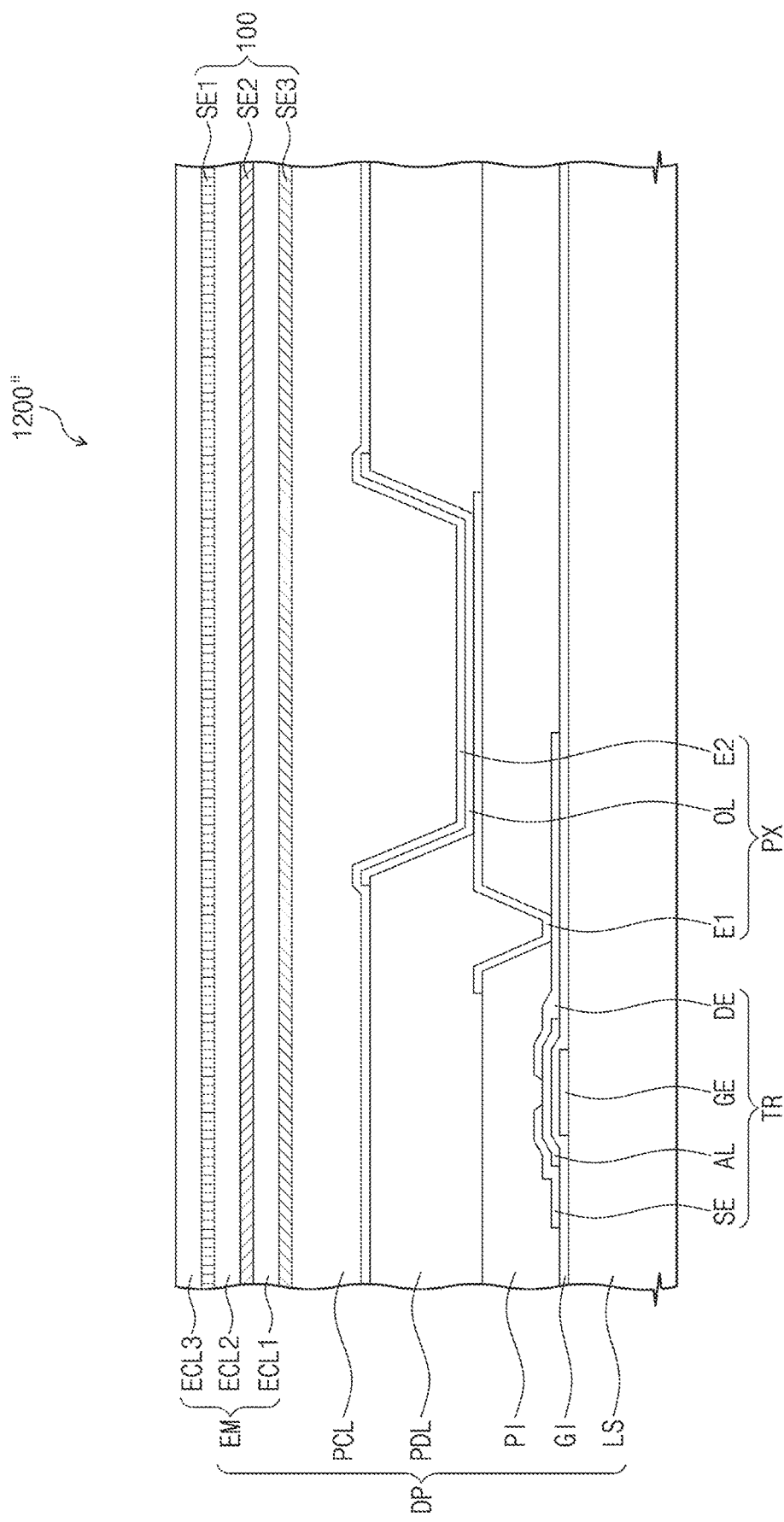
FIG. 15 is a cross-sectional view of an electronic device, according to one or more exemplary embodiments.

FIG. 15 is a cross-sectional view of an electronic device, according to one or more exemplary embodiments. For convenience, the electronic device 1200" of FIG. 15 is illustrated and described with respect to a display device, however, exemplary embodiments are not limited thereto or thereby. The display device 1200" of FIG. 15 is similar in structure and function as the display device 1200 of FIG. 13, and, as such, duplicative descriptions have been omitted to avoid obscuring exemplary embodiments described herein. In this manner, different features associated with a position of sensor 100 will be primarily described below. Further, although the sensor is referred to as sensor 100, it is noted that the sensor may refer to at least one of the previously described sensors 100, 100', 100", 400, 400', 400", 400''', 800, and 1000.

Referring to FIG. 15, at least one sensor electrode of the first to third sensor electrodes SE1 to SE3 may be disposed between the first to third encapsulation layers ECL1 to ECL3. For instance, the first sensor electrode SE1 may be disposed between the second and third encapsulation layers ECL2 and ECL3, the second sensor electrode SE2 may be disposed between the first and second encapsulation layers ECL1 and ECL2, and the third sensor electrode SE3 may be disposed between the first encapsulation layer ECL1 and the pixel cover layer PCL. In this manner, the first and second encapsulation layers ECL1 and ECL2 have substantially the same structure and function as those of the first and second insulation layers IL1 and IL2 shown in FIG. 13, and may be indicated as (or provided as) the first and second insulating layers IL1 and IL2.

Figure 16:
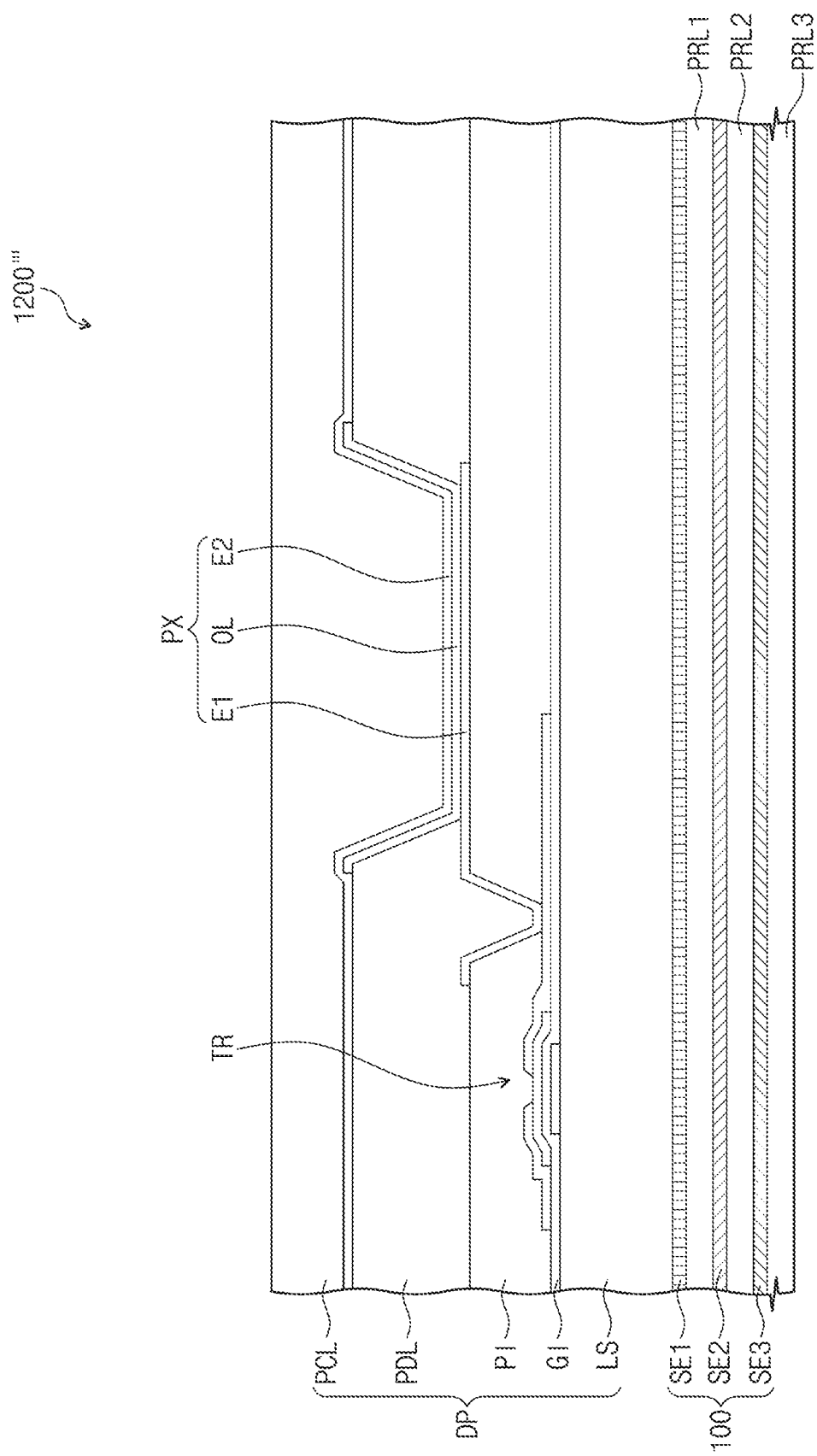
FIG. 16 is a cross-sectional view of an electronic device, according to one or more exemplary embodiments.

FIG. 16 is a cross-sectional view of an electronic device, according to one or more exemplary embodiments. For convenience, the electronic device 1200''' of FIG. 16 is illustrated and described with respect to a display device, however, exemplary embodiments are not limited thereto or thereby. The display device 1200''' of FIG. 16 is similar in structure and function as the display device 1200 of FIG. 13, and, as such, duplicative descriptions have been omitted to avoid obscuring exemplary embodiments described herein. In this manner, different features associated with a position of sensor 100 will be primarily described below. Further, although the sensor is referred to as sensor 100, it is noted that the sensor may refer to at least one of the previously described sensors 100, 100', 100", 400, 400', 400", 400''', 800, and 1000.

Referring to FIG. 16, the sensor 100 may be disposed under the lower substrate LS. In this manner, the first sensor electrode SE1 may make contact with the lower surface of the lower substrate LS.

According to one or more exemplary embodiments, the display part DP may include a plurality of protective layers disposed under the lower substrate LS. The protective layers may include first, second, and third protective layers PRL1, PRL2, and PRL3. The first to third protective layers PRL1 to PRL3 may be sequentially coated on the lower substrate LS or attached to the lower substrate LS with an adhesive. The first to third protective layers PRL1 to PRL3 may protect the display part DP from external impacts.

In one or more exemplary embodiments, at least one sensor electrode of the first to third sensor electrodes SE1 to SE3 may be disposed between the first to third protective layers PRL1 to PRL3. For instance, the first sensor electrode SE1 may be disposed between the lower substrate LS and the first protective layer PRL1, the second sensor electrode SE2 may be disposed between the first and second protective layers PRL1 and PRL2, and the third sensor electrode SE3 may be disposed between the second and third protective layers PRL2 and PRL3. In this manner, the first and second protective layers PRL1 and PRL2 have substantially the same structure and function as those of the first and second insulation layers IL1 and IL2 shown in FIG. 13, and may be indicated as (or provided as) the first and second insulating layers IL1 and IL2.

Figure 17:
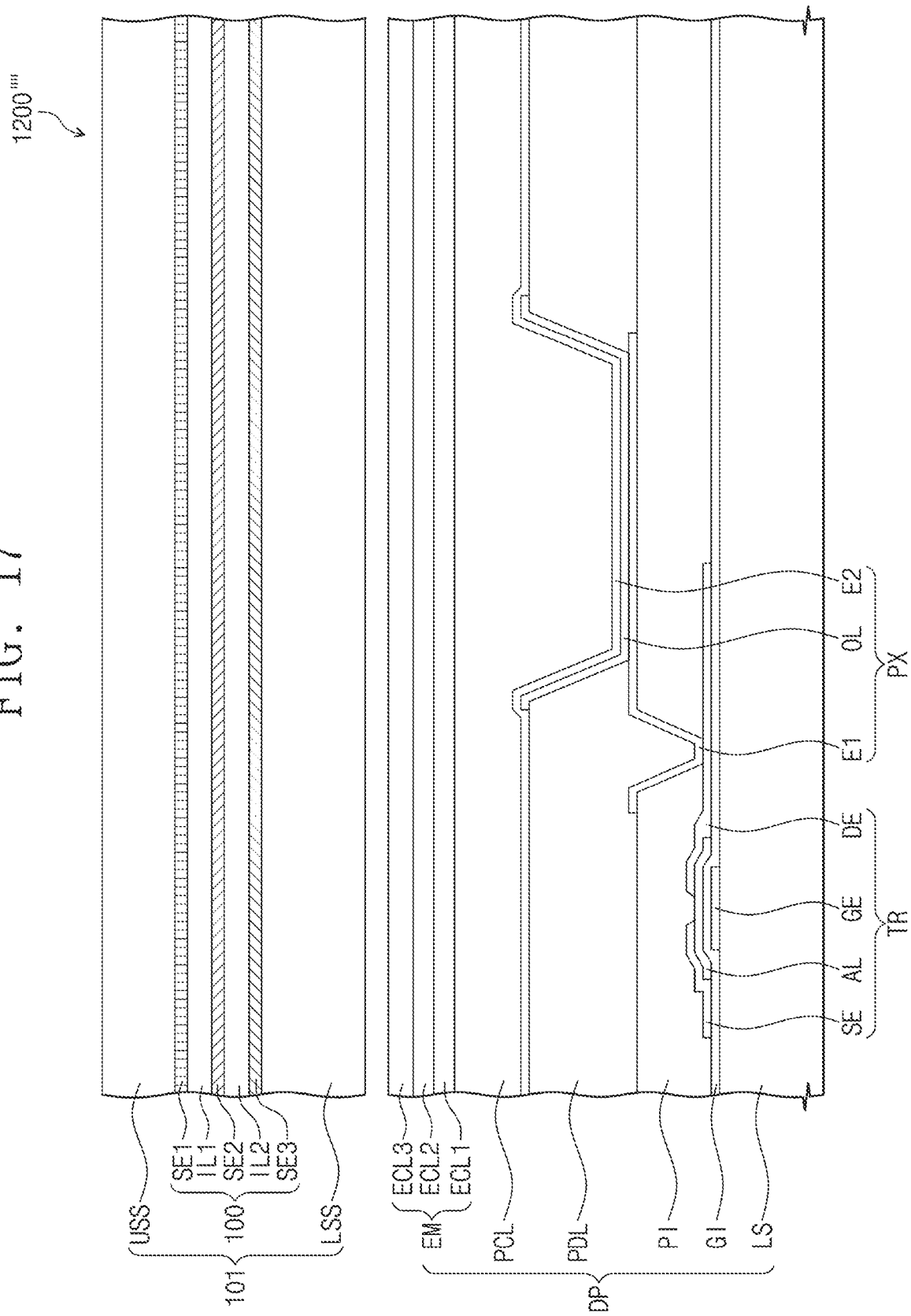
FIG. 17 is a cross-sectional view of an electronic device, according to one or more exemplary embodiments.

FIG. 17 is a cross-sectional view of an electronic device, according to one or more exemplary embodiments. For convenience, the electronic device 1200''' of FIG. 17 is illustrated and described with respect to a display device, however, exemplary embodiments are not limited thereto or thereby. The display device 1200''' of FIG. 17 is similar in structure and function as the display device 1200 of FIG. 13, and, as such, duplicative descriptions have been omitted to avoid obscuring exemplary embodiments described herein. In this manner, different features associated with a position of sensor 100 will be primarily described below. Further, although the sensor is referred to as sensor 100, it is noted that the sensor may refer to at least one of the previously described sensors 100, 100', 100", 400, 400', 400", 400''', 800, and 1000.

Referring to FIG. 17, the display device 1200''' may further include a separate sensor module 101 disposed on the display part DP. The sensor module 101 may be attached to the display part DP by an adhesive, such as an OCA, or physically coupled to the display part DP. The sensor module 101 may include a lower sensor substrate LSS, an upper sensor substrate USS, and the sensor 100. The sensor 100 may be disposed between the lower sensor substrate LSS and the upper sensor substrate USS.

Figure 18:
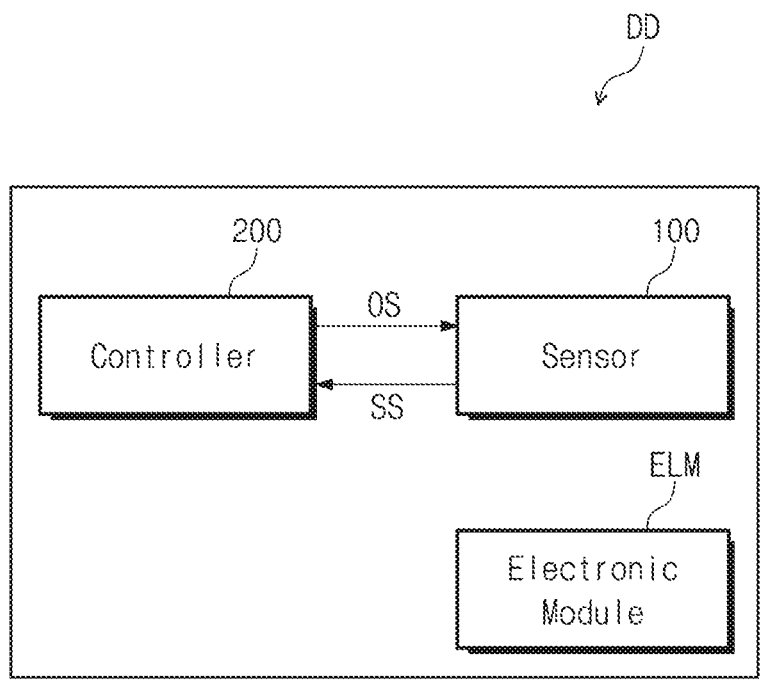
FIG. 18 is a block diagram of an electronic device, according to one or more exemplary embodiments.

FIG. 18 is a block diagram of an electronic device, according to one or more exemplary embodiments.

Referring to FIG. 18, the electronic device DD includes a controller 200, an electronic module ELM, and the sensor 100. Although the sensor is referred to as sensor 100, it is noted that the sensor may refer to at least one of the previously described sensors 100, 100', 100", 400, 400', 400", 400''', 800, and 1000.

The electronic device DD may be implemented as (or applied to) not only the display device 1200 of FIG. 12, but also as a large-sized electronic item, such as a television set, an outdoor billboard, etc., and a small and medium-sized electronic item, such as a personal computer, a notebook computer, a tablet, a personal digital assistant, a car navigation unit, a game unit, a mobile electronic device, a wrist-type electronic device, a camera, etc. It is noted, however, that exemplary embodiments are not limited thereto or thereby. In addition, the electronic device DD may be applied to a wearable electronic cloth.

According to one or more exemplary embodiments, the controller 200 generates a driving signal OS, such as the detecting signal (also referred to as a "Tx" signal), to drive and control the sensor 100, and applies the driving signal OS to the sensor 100. The controller 200 receives a sensing signal SS (also referred to as a "RX" signal) from the sensor 100 and calculates (or otherwise determines) sensing information on the basis of the sensing signal SS. The sensing information may include, for example, a touch coordinate and deformation information of the sensor 100. The deformation information of the sensor 100 may include a deformation coordinate, a deformation value, and three-dimensional spatial information of the sensor 100, such as three-dimensional spatial information with respect to the distances between adjacent sensing electrodes, e.g., the first to third sensing electrodes SE1 to SE3. Although not shown in FIG. 18, the controller 200 may be implemented on a printed circuit board, and, in addition, the controller 200 may be implemented as an electronic circuit configured to include a micro-processor including an integrated circuit and a memory chip.

The electronic module ELM may be, for example, an electronic device, such as the display part DP of FIG. 12.

The sensor 100 senses a touch event from outside of the electronic device DD by an external object (e.g., an appendage, stylus, etc.), generates the sensing signal SS on the basis of the sensed touch event, and applies the sensing signal SS to the controller 200. The touch event sensed by the sensor 100 may occur not only by the contact of the external object, but also by a hovering (or almost contact) event of the external object. The controller 200 may calculate a coordinate of a position at which the touch event occurs on the basis of the sensing signal SS.

According to one or more exemplary embodiments, the sensor 100 may perform a multi-sensing function. The term "multi-sensing" as used herein means that the sensor 100 senses the touch event and/or the physical deformation of the sensor 100 caused by external force simultaneously or at different times, or senses two or more different physical deformations simultaneously or at different times. The sensor 100 may generate the sensing signal SS on the basis of the sensed touch and/or deformation. As an example of the sensor 100 sensing the physical deformation, the sensor 100 may sense a curvature of the sensor 100, a pressure applied to the sensor 100, and a stretch of the sensor 100. The sensor 200 may calculate the deformation information on the basis of the sensing signal SS.

In one or more exemplary embodiments, the sensor 100 may be coupled to the electronic module ELM. When the electronic module ELM is deformed by the external force, the sensor 100 may be deformed with the electronic module ELM. In this manner, the sensor 100 may sense not only the deformation of the sensor 100, but also the deformation of the electronic module ELM. To this end, the controller 200 may calculate the deformation coordinate of the electronic module ELM, the deformation value of the deformed electronic module ELM, and the three-dimensional spatial information of the electronic module ELM on the basis of the sensing signal SS. As previously mentioned, the electronic module ELM may be an electronic device, such as the display part DP of FIG. 12.

Figure 19:
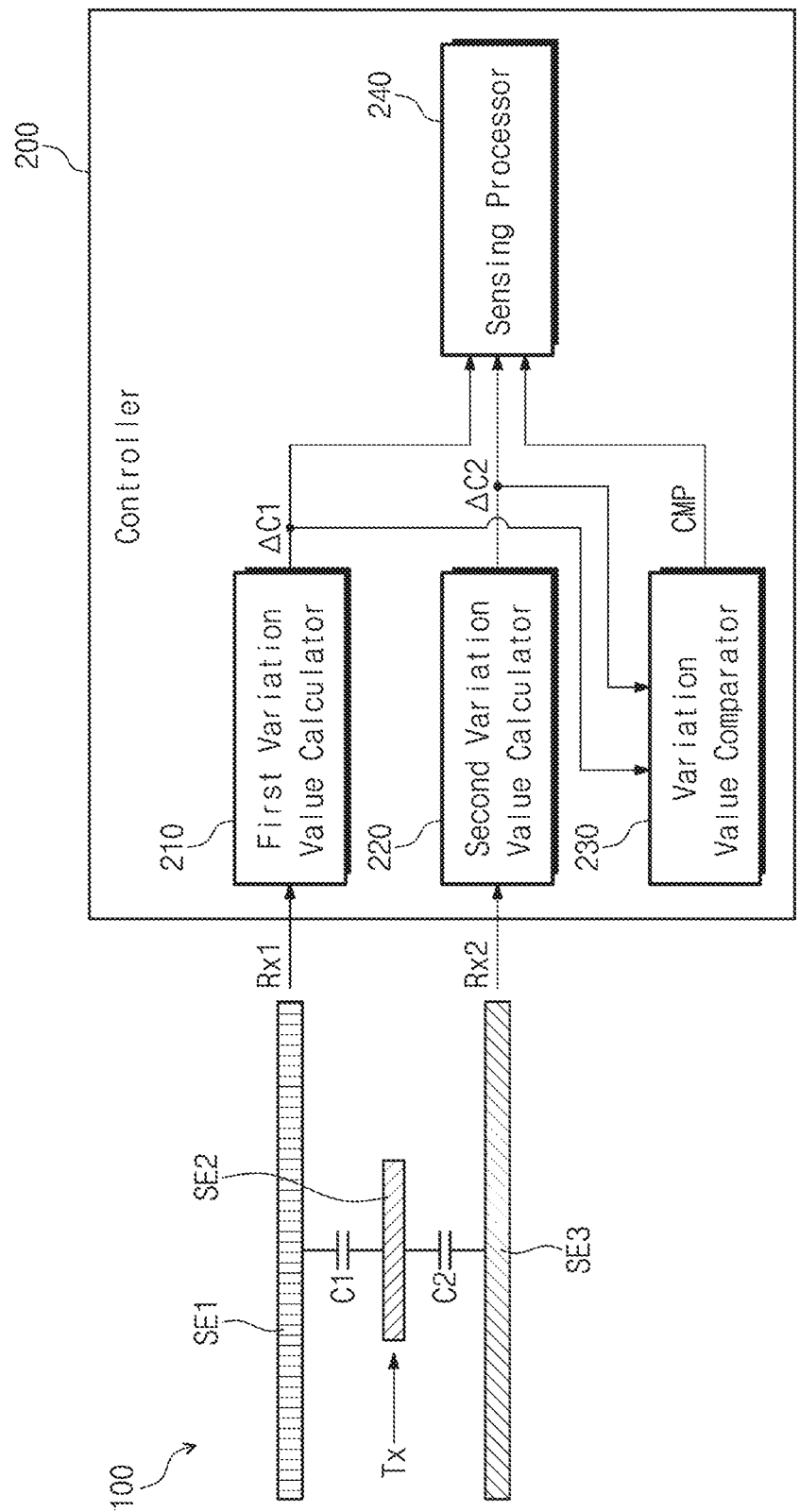
FIG. 19 is a block diagram of a sensor and a controller of an electronic device, according to one or more exemplary embodiments.

FIG. 19 is a block diagram of a sensor and a controller, according to one or more exemplary embodiments. Although the sensor is referred to as sensor 100, it is noted that the sensor may refer to at least one of the previously described sensors 100, 100', 100'', 400, 400', 400'', 400''', 800, and 1000.

Referring to FIG. 19, the second sensor electrode SE2 receives the detecting signal TX as the driving signal OS (refer to FIG. 18), and the first and third sensor electrodes SE1 and SE3 output first and second sensing signals Rx1 and Rx2 as the sensing signal SS (refer to FIG. 18). The first and second sensing signals Rx1 and Rx2 may have values of the first and second capacitances C1 and C2, and information on variation values of the first and second capacitances C1 and C2.

According to one or more exemplary embodiments, the detecting signal Tx may be, but is not limited to, a pulse signal in which alternating signals are repeatedly provided. The detecting signal Tx may be provided in plural. The detecting signals may have different information from each other. For instance, the expression "the detecting signals Tx may have different information from each other" as used herein means that the detecting signals Tx have different time information, different frequency information, and different code information from each other. When the detecting signals Tx are modulated by a time division multiple access method, the detecting signals Tx may be activated in different intervals. As such, the detecting signals TX may have a high level in different intervals. When the detecting signals Tx are modulated by a frequency division multiple access method, the detecting signals Tx may have different frequencies from each other. When the detecting signals Tx are modulated by a code division multiple access method, the detecting signals Tx may have different code information.

The controller 200 includes a first variation value calculator 210, a second variation value calculator 220, a variation value comparator 230, and a sensing processor 240.

In one or more exemplary embodiments, the first variation value calculator 210 calculates a variation value of the first capacitance C1 as a first variation value $\Delta C1$ and applies (or otherwise transmits) the first variation value $\Delta C1$ to the variation value comparator 230 and the sensing processor 240. The first variation value calculator 210 calculates the variation value of the first capacitance C1 according to a time lapse as the first variation value $\Delta C1$ on the basis of the first sensing signal Rx1.

When the capacitance of the first capacitance C1 after the first capacitance C1 is changed is greater than the capacitance of the first capacitance C1 before the first capacitance C1 is changed, the first variation value $\Delta C1$ is a positive number, and when the capacitance of the first capacitance C1 after the first capacitance C1 is changed is smaller than the capacitance of the first capacitance C1 before the first capacitance C1 is changed, the first variation value $\Delta C1$ is a negative number.

In one or more exemplary embodiments, the second variation value calculator 220 calculates a variation value of the second capacitance C2 as a second variation value $\Delta C2$ and applies the second variation value $\Delta C2$ to the variation value comparator 230 and the sensing processor 240. The second variation value calculator 220 calculates the variation value of the second capacitance C2 in accordance with the time lapse as the second variation value $\Delta C2$ on the basis of the second sensing signal Rx2.

When the capacitance of the second capacitance C2 after the second capacitance C2 is changed is greater than the capacitance of the second capacitance C2 before the second capacitance C2 is changed, the second variation value $\Delta C2$ is a positive number. When the capacitance of the second capacitance C2 after the second capacitance C2 is changed is smaller than the capacitance of the second capacitance C2 before the second capacitance C2 is changed, the second variation value $\Delta C2$ is a negative number.

According to one or more exemplary embodiments, the variation value comparator 230 compares the first and second variation values ΔC1 and ΔC2 to generate a comparison value CMP and applies the comparison value CMP to the sensing processor 240. The variation value comparator 230 generates a first difference value corresponding to a difference value between the first variation value ΔC1 and the second variation value ΔC2 and/or a second difference value corresponding to a difference value between an absolute value of the first variation value ΔC1 and an absolute value of the second variation value ΔC2. In one or more exemplary embodiments, the sensing processor 240 may calculate the deformation of the sensor 100 on the basis of the first and second variation values ΔC1 and ΔC2 and the comparison value CMP. As an example, the sensing processor 240 may calculate the deformation of the sensor 100 on the basis of the first and second variation values ΔC1 and ΔC2 without the comparison value CMP. The sensing processor 240 may enter into one mode of a plural modes on the basis of the first and second variation values ΔC1 and ΔC2 and the comparison value CMP, which are applied to the sensing processor 240. In this manner, the sensing processor 240 calculates the touch coordinate or the deformation information of the sensor 100 in accordance with the entered mode.

FIG. 20 is a table of modes of a sensing processor, according to one or more exemplary embodiments.

Referring to FIG. 20, the sensing processor 240 may operate in four modes. The four modes include a curve sensing mode, a pressure sensing mode, a stretch sensing mode, and a touch sensing mode. It is contemplated, however, that the sensing processor 240 may include any suitable number of modes, as well as other modes associated with different types of flexing events, such as a compression mode, a twisting mode, etc. The sensing processor 240 enters into only one mode or into two or more modes of plural modes on the basis of the first and second variation values ΔC1 and ΔC2 and the comparison value CMP that are applied to the sensing processor 240.

According to one more exemplary embodiments, when each of the first and second variation values ΔC1 and ΔC2 is a positive number, the sensing processor 240 enters into the curve sensing mode and determines whether the first to third sensor electrodes SE1 to SE3 are convexly curved upward or convexly curved downward on the basis of the comparison value CMP in the curve sensing mode. In the following description, the expression "convexly curved downward" may be understood as "concave" bending and the expression "convexly curved upward" may be understood as "convex" bending.

Figure 21A:
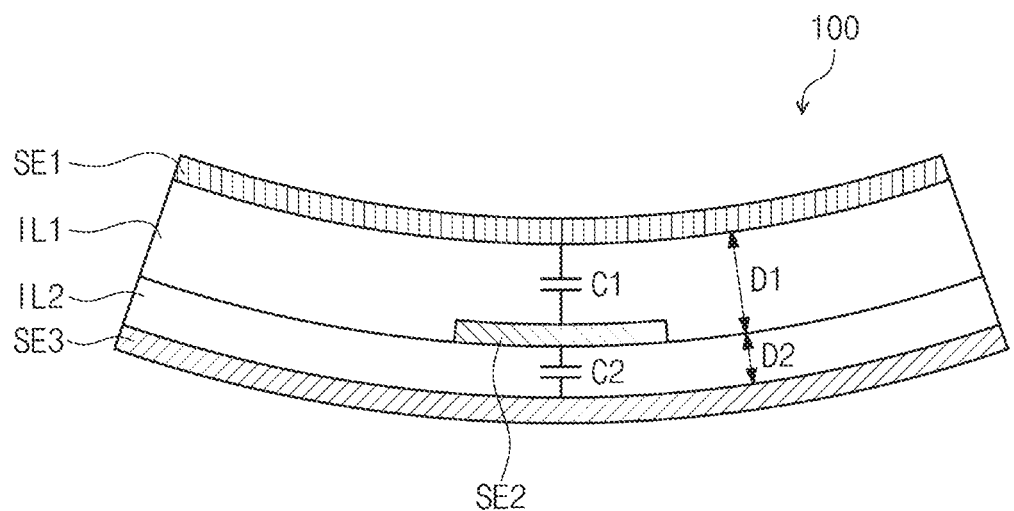
FIG. 21A is a cross-sectional view of a sensor bent in a first (e.g., downwardly) direction to form a concave curve, according to one or more exemplary embodiments.
Figure 21B:
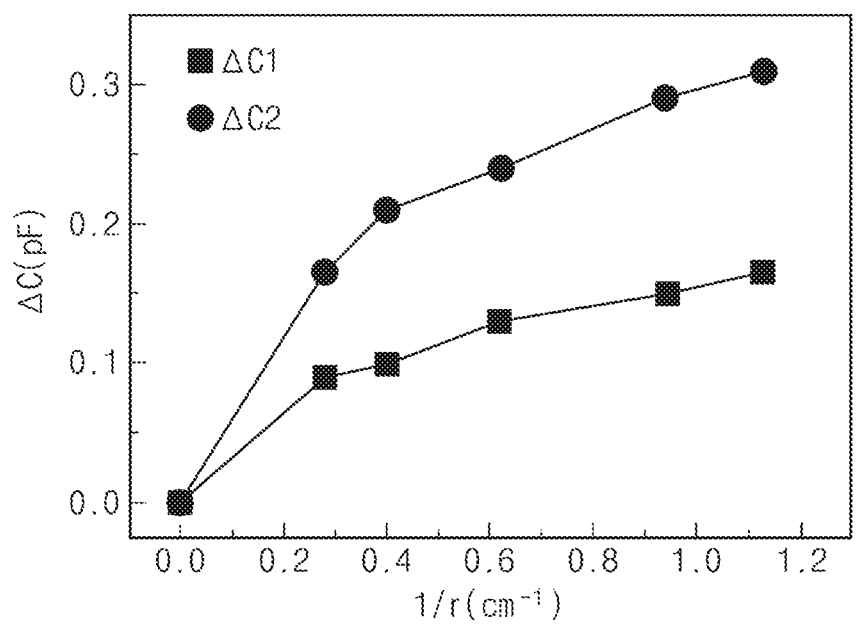
FIG. 21B is a graph comparing first and second variation values sensed by the sensor in FIG. 21A, according to one or more exemplary embodiments.
Figure 21C:
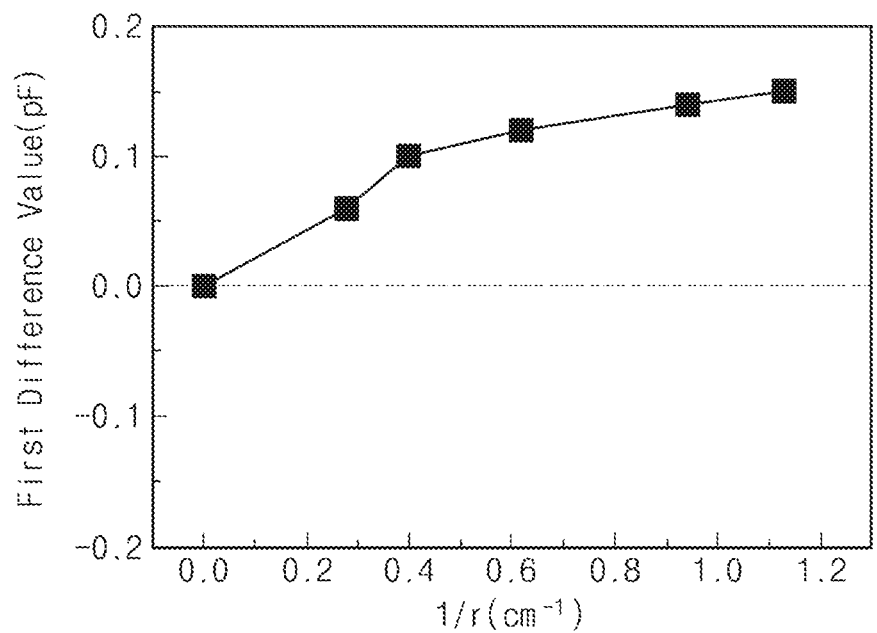
FIG. 21C is a graph comparing a first difference value between the first and second variation values of FIG. 21B, according to one or more exemplary embodiments.

FIG. 21A is a cross-sectional view of a sensor bent in a first (e.g., downwardly) direction to form a concave curve, according to one or more exemplary embodiments. FIG. 21B is a graph comparing first and second variation values sensed by the sensor in FIG. 21A, according to one or more exemplary embodiments. FIG. 21C is a graph comparing a first difference value between the first and second variation values of FIG. 21B, according to one or more exemplary embodiments. For illustrative and descriptive convenience, the sensor of FIG. 21A is described with reference to sensor 100 of FIG. 1.

As shown in FIG. 21A, when the sensor 100 is convexly curved downward, the first and second electrode distances D1 and D2 become smaller. In addition, the second electrode distance D2 is smaller than the first electrode distance D1. Accordingly, the first and second variation values ΔC1 and ΔC2 are positive numbers as shown in FIG. 21B, and the first difference value obtained by subtracting the first variation value ΔC1 from the second variation value ΔC2 is a positive number given that the first variation value ΔC1 is smaller than the second variation value ΔC2. As such, the sensing processor 240 will enter into the curve sensing mode when the first and second variation values ΔC1 and ΔC2 are positive numbers, and the sensing processor 240 will determine that the sensor 100 is convexly curved downward when the first difference value is a positive number. It is noted that the first difference value will become greater in accordance with increasing curvature of the sensor 100. As such, the sensor 100 may calculate a degree of the downward curve of the sensor 100 and a curvature corresponding to the degree of the downward curve of the sensor 100 on the basis of the comparison value CMP having the first difference value.

Figure 22A:
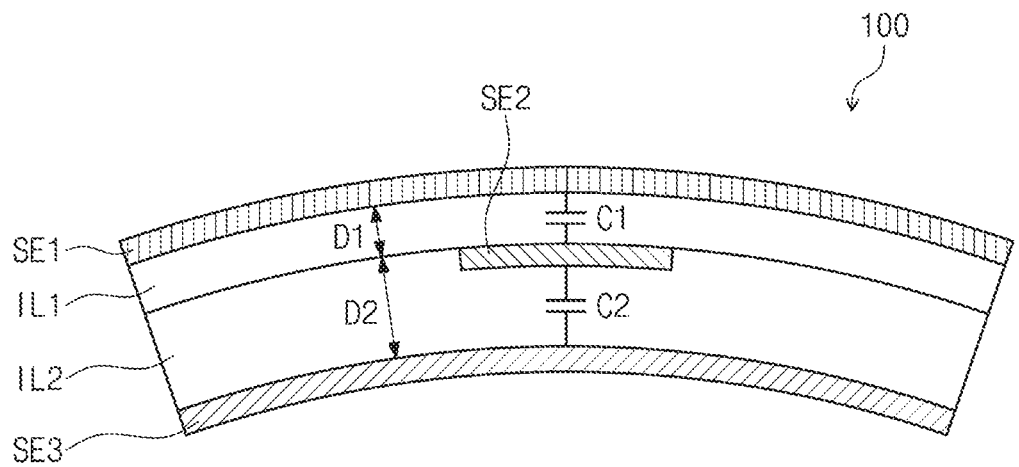
FIG. 22A is a cross-sectional view of a sensor bent in a second (e.g., upwardly) direction to form a convex curve, according to one or more exemplary embodiments.
Figure 22B:
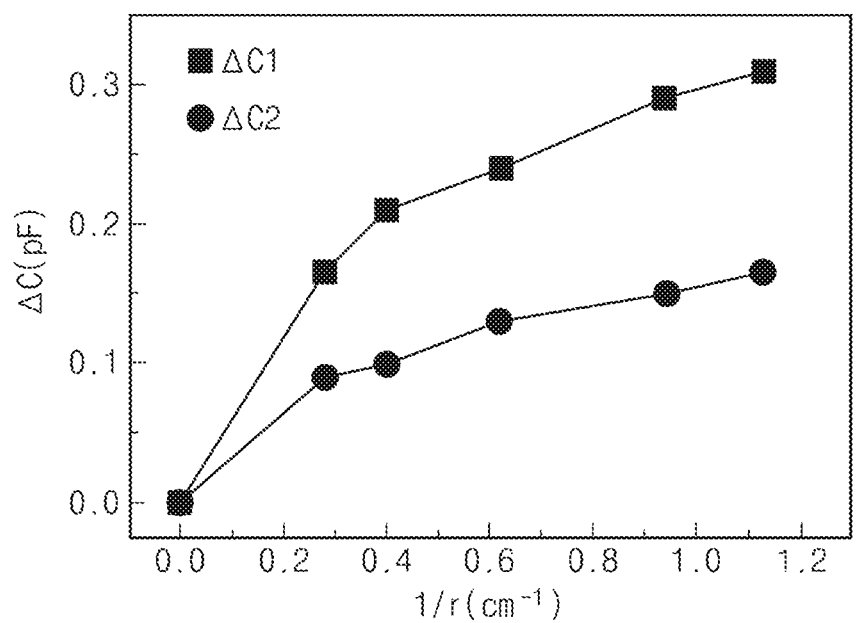
FIG. 22B is a graph comparing first and second variation values sensed by the sensor in FIG. 22A, according to one or more exemplary embodiments.
Figure 22C:
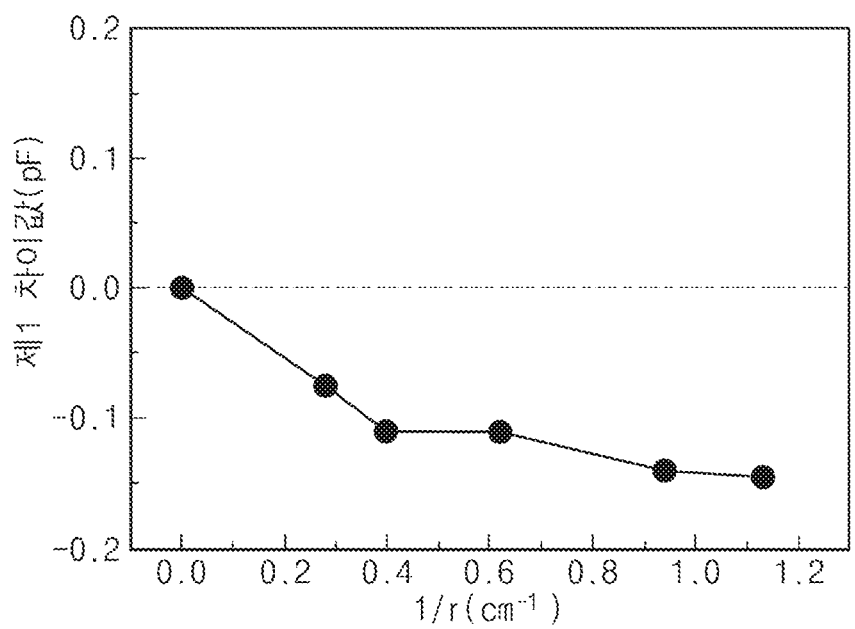
FIG. 22C is a graph comparing a first difference value between the first and second variation values of FIG. 22B, according to one or more exemplary embodiments.

FIG. 22A is a cross-sectional view of a sensor bent in a second (e.g., upwardly) direction to form a convex curve, according to one or more exemplary embodiments. FIG. 22B is a graph comparing first and second variation values sensed by the sensor in FIG. 22A, according to one or more exemplary embodiments. FIG. 22C is a graph comparing a first difference value between the first and second variation values of FIG. 22B, according to one or more exemplary embodiments. For illustrative and descriptive convenience, the sensor of FIG. 21A is described with reference to sensor 100 of FIG. 1.

As shown in FIG. 22A, when the sensor 100 is convexly curved upward, the first and second electrode distances D1 and D2 become smaller. In addition, the first electrode distance D1 is smaller than the second electrode distance D2. Accordingly, the first and second variation values ΔC1 and ΔC2 are positive numbers as shown in FIG. 22B, and the first difference value obtained by subtracting the first variation value ΔC1 from the second variation value ΔC2 is a negative number given that the second variation value ΔC2 is smaller than the first variation value ΔC1. As such, the sensing processor 240 will enter into the curve sensing mode when the first and second variation values ΔC1 and ΔC2 are positive numbers. The sensing processor 240 will also determine that the sensor 100 is convexly curved upward when the first difference value is a negative number. It is noted that the first difference value will become greater in accordance with increasing curvature of the sensor 100. As such, the sensor 100 may calculate a degree of the upward curve of the sensor 100 and a curvature corresponding to the degree of the upward curve of the sensor 100 on the basis of the comparison value CMP having the first difference value.

Figure 23A:
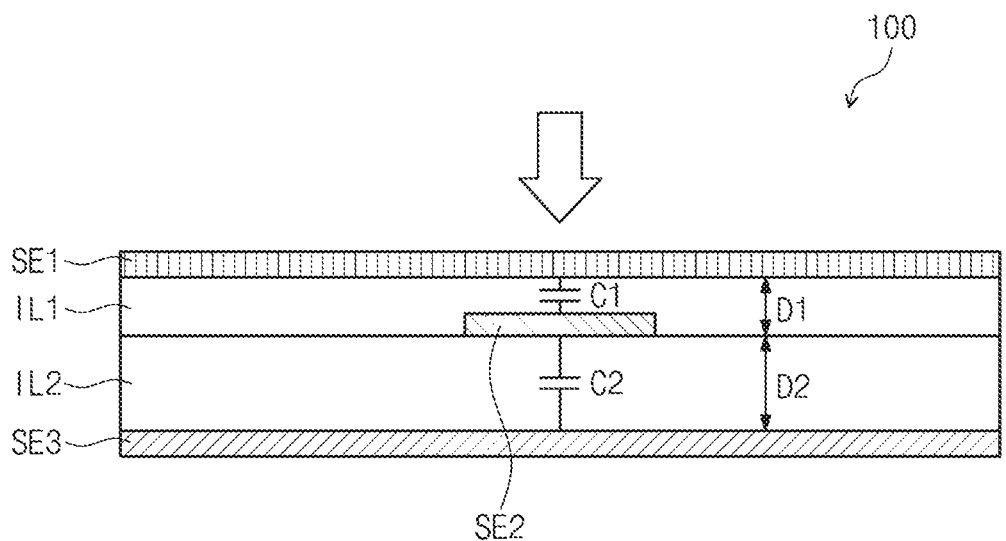
FIG. 23A is a cross-sectional view of a sensor applied with pressure at a first (e.g., upper) side of the sensor, according to one or more exemplary embodiments.
Figure 23B:
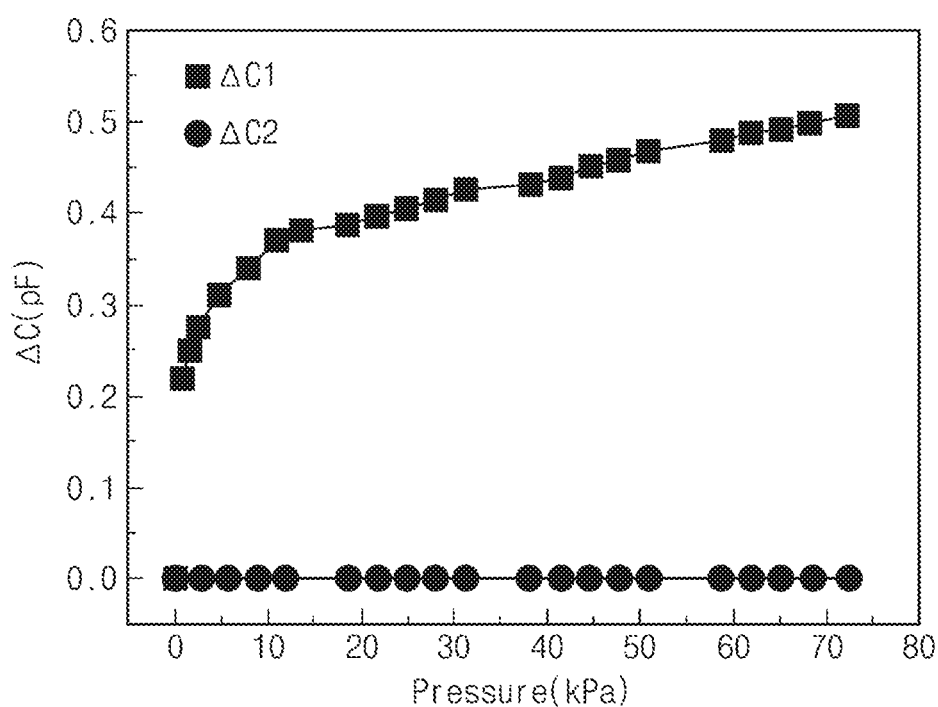
FIG. 23B is a graph comparing first and second variation values sensed by the sensor in FIG. 23A, according to one or more exemplary embodiments.

FIG. 23A is a cross-sectional view of a sensor applied with pressure at a first (e.g., upper) side of the sensor, according to one or more exemplary embodiments. FIG. 23B is a graph comparing first and second variation values sensed by the sensor in FIG. 23A, according to one or more exemplary embodiments. For illustrative and descriptive convenience, the sensor of FIG. 21A is described with reference to sensor 100 of FIG. 1.

Referring to FIG. 23A, when a pressure is applied to the first sensor electrode SE1 from the upper side of the sensor 100, the first electrode distance D1 decreases, but the second electrode distance D2 may not change. Accordingly, the first variation value ΔC1 will be a positive number, the second variation value ΔC2 will be substantially zero, and the first difference value obtained by subtracting the first variation value ΔC1 from the second variation value ΔC2 will be a negative number. Here, the expression "a specific value is substantially zero" means that the specific value has a mathematical zero or a mathematical value approximate to zero, e.g., a value having substantially the same meaning as zero in view of the purpose and effect of the aforementioned exemplary embodiment, a value statistically treated as zero in terms of data processing, etc. Although not shown, when the pressure is applied to the third sensor electrode SE3 from the lower side of the sensor 100, the first variation value ΔC1 will be substantially zero, the second variation value ΔC2 will be a positive number, and the first difference value will be a positive number.

According to one or more exemplary embodiments, the sensing processor 240 will enter into the pressure sensing mode when one variation value of the first and second variation values ΔC1 and ΔC2 is maintained without change and the other variation value of the first and second variation values ΔC1 and ΔC2 is a positive number. To this end, the sensing processor 240 will determine whether the pressure is applied in a direction from the first sensor electrode SE1 towards the third sensor electrode SE3 or from the third sensor electrode SE3 towards the first sensor electrode SE1 on the basis of the comparison value CMP being the first difference value. It is noted that the first difference value will become greater in accordance with increasing pressure applied to the sensor 100. In this manner, the sensor 100 may calculate a level of the pressure applied to the sensor 100 on the basis of the magnitude of the comparison value CMP that, as previously mentioned, will be the first difference value.

Figure 24A:
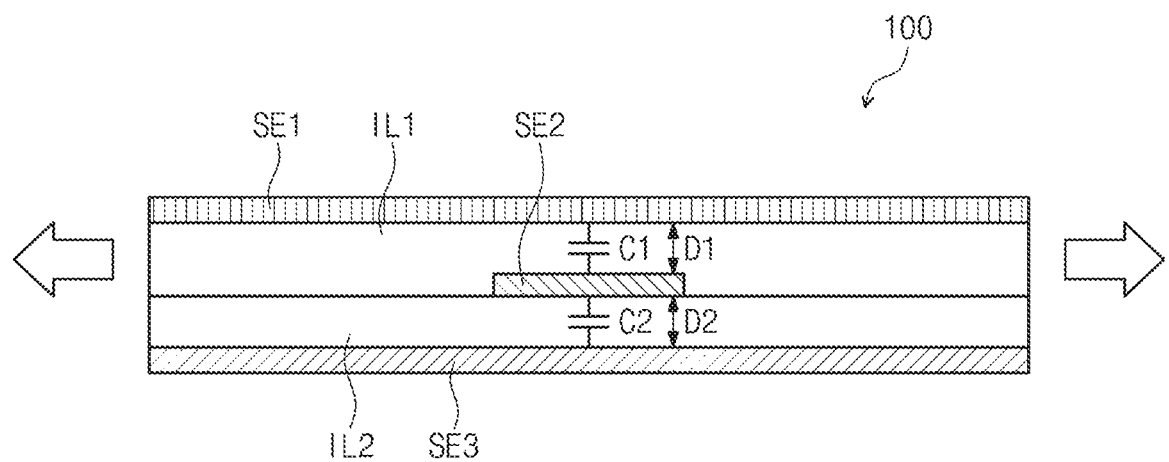
FIG. 24A is a cross-sectional view of a sensor being stretched in a first (e.g., outwardly) direction, according to one or more exemplary embodiments.
Figure 24B:
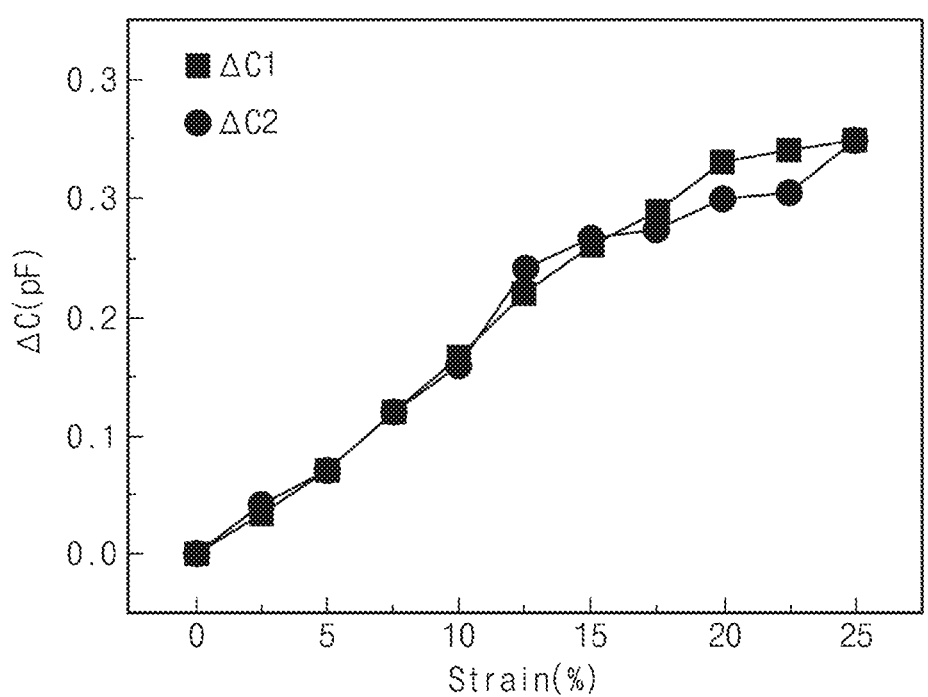
FIG. 24B is a graph comparing first and second variation values sensed by the sensor in FIG. 24A, according to one or more exemplary embodiments.

FIG. 24A is a cross-sectional view of a sensor being stretched in a first (e.g., outwardly) direction, according to one or more exemplary embodiments. FIG. 24B is a graph comparing first and second variation values sensed by the sensor in FIG. 24A, according to one or more exemplary embodiments. For illustrative and descriptive convenience, the sensor of FIG. 21A is described with reference to sensor 100 of FIG. 1.

As shown in FIG. 24A, when the sensor 100 is stretched, the first and second electrode distances D1 and D2 will decrease. In addition, the first electrode distance D1 may be substantially the same as the second electrode distance D2. Accordingly, the first and second variation values ΔC1 and ΔC2 are positive numbers as shown in FIG. 24B, and the second variation value ΔC2 is substantially the same as the first variation value ΔC1 as shown in FIG. 24B. In this manner, the first difference value obtained by subtracting the first variation value ΔC1 from the second variation value ΔC2 may be zero. As such, the sensing processor 240 will enter into the stretch sensing mode when the first and second variation values ΔC1 and ΔC2 are positive numbers and the first difference value is zero. It is noted that as the first and second electrode distances D1 and D2 decrease in accordance with increasing strain of the sensor 100, the first and second variation values ΔC1 and ΔC2 increase. As such, the sensor 100 may calculate the stretched length of the sensing part 100 or a strain of the sensor 100 on the basis of the levels of the first and second variation values ΔC1 and ΔC2.

Although not illustrated, when the sensor 100 is compressed, the first and second electrode distances D1 and D2 will increase. In this manner, the first electrode distance D1 may be substantially the same as the second electrode distance D2. Accordingly, the first and second variation values ΔC1 and ΔC2 may be negative numbers, and the second variation value ΔC2 may be substantially the same as the first variation value ΔC1. To this end, the first difference value obtained by subtracting the first variation value ΔC1 from the second variation value ΔC2 may be zero. As such, the sensing processor 240 will enter into a compression sensing mode when the first and second variation values ΔC1 and ΔC2 are negative numbers and the first difference value is zero. It is noted that as the first and second electrode distances D1 and D2 increase in accordance with increasing compression of the sensor 100, the first and second variation values ΔC1 and ΔC2 will increase in magnitude. As such, the sensor 100 may calculate the compressed amount of the sensor 100 on the basis of the levels of the first and second variation values ΔC1 and ΔC2.

Figure 25:
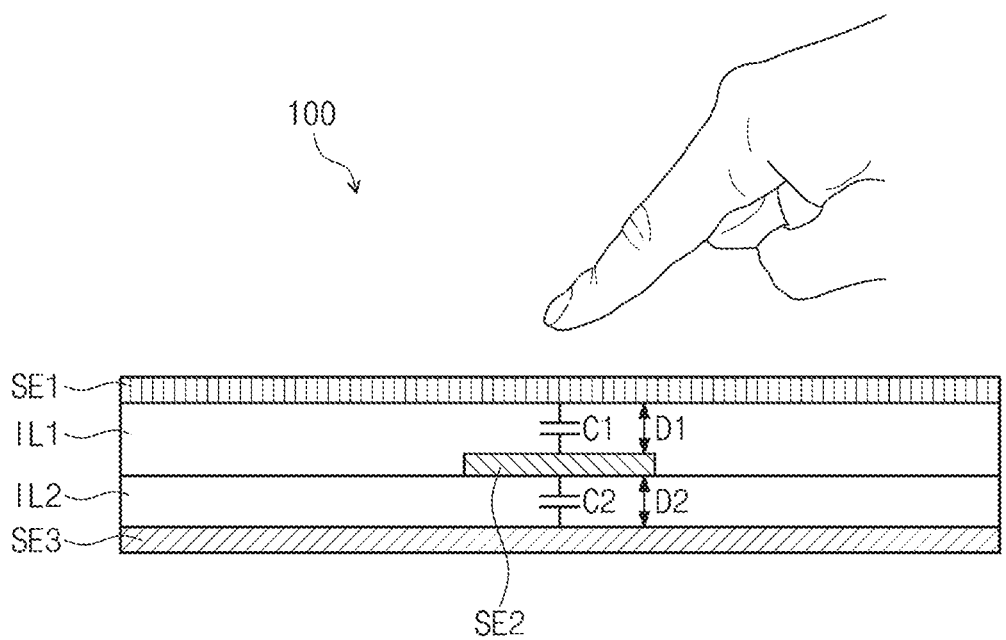
FIG. 25 is a cross-sectional view demonstrating a variation in capacitance in response to a touch event with respect to a sensor, according to one or more exemplary embodiments.

FIG. 25 is a cross-sectional view demonstrating a variation in capacitance in response to a touch event with respect to a sensor, according to one or more exemplary embodiments. For illustrative and descriptive convenience, the sensor of FIG. 21A is described with reference to sensor 100 of FIG. 1.

As shown in FIG. 25, when a touch event occurs on (or in association with) the first sensor electrode SE1, the first and second electrode distances D1 and D2 are not changed, but the first and second capacitances C1 and C2 decrease by the touch event. Accordingly, the first and second variation values ΔC1 and ΔC2 may be negative numbers. In addition, the first sensor electrode SE1 is disposed closer to an object (e.g., a human finger) causing the touch event than the third sensor electrode SE3. In this manner, an absolute value of the first variation value ΔC1 may be greater than an absolute value of the second variation value ΔC2. A second difference value obtained by subtracting the absolute value of the first variation value ΔC1 from the absolute value of the second variation value ΔC2 may be a negative number. Although not shown in figures, when the touch event occurs on the third sensor electrode SE3 instead of the first sensor electrode SE1, the second difference value may be a positive value.

According to one or more exemplary embodiments, the sensing processor 240 will enter into the touch sensing mode when each of the first and second variations values ΔC1 and ΔC2 is a negative number. The sensing processor 240 will determine whether the touch event occurs on the first sensor electrode SE1 or on the third sensor electrode SE3 on the basis of the comparison value CMP having the second difference value.

Figure 26:
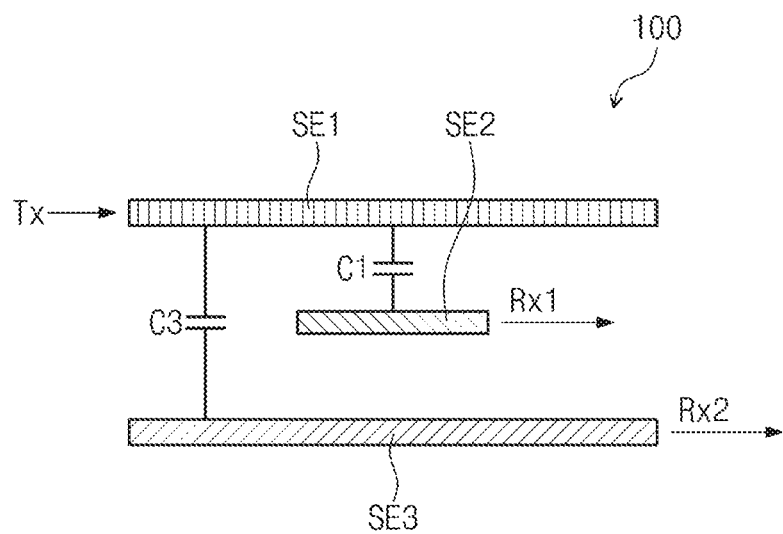
FIG. 26 is a cross-sectional view of a sensor, according to one or more exemplary embodiments.

FIG. 26 is a cross-sectional view of a sensor, according to one or more exemplary embodiments. The sensor 100 of FIG. 26 is similar in structure and function as the sensor 100 of FIG. 19, and, as such, duplicative descriptions have been omitted to avoid obscuring exemplary embodiments described herein. In this manner, different features associated with the transmission of signals will be described below.

Referring to FIG. 26, the first sensor electrode SE1 receives the detecting signal Tx, and the second and third sensor electrodes SE2 and SE3 output the first and second sensing signals Rx1 and Rx2, respectively. The first sensing signal Rx1 has information on the value of the first capacitance C1 and a variation value of the first capacitance C1. The second sensing signal Rx2 has information on the value of the third capacitance C3 defined between the first and third sensor electrodes SE1 and SE3 and a variation value of the third capacitance C3. In this manner, the sensor 100 of FIG. 26 and the controller 200 of FIG. 18 may perform the above-mentioned multi-sensing function using the first and third capacitances C1 and C3 instead of using the first and second capacitances C1 and C2.

FIG. 27 is a cross-sectional view of a sensor, according to one or more exemplary embodiments. The sensor 100 of FIG. 27 is similar in structure and function as the sensor 100 of FIG. 19, and, as such, duplicative descriptions have been omitted to avoid obscuring exemplary embodiments described herein. In this manner, different features associated with the transmission of signals will be described below.

Referring to FIG. 27, the second sensor electrode SE2 receives a first detecting signal Tx1 in a first sensing period, and the first sensor electrode SE1 outputs the first sensing signal Rx1. The first variation value calculator 210 receives the first sensing signal Rx1 in the first sensing period. The second sensor electrode SE2 receives a second detecting signal Tx2 in a second sensing period, and the third sensor electrode SE3 outputs the second sensing signal Rx2. The second variation value calculator 220 receives the second sensing signal Rx2 in the second sensing period. According to one or more exemplary embodiments, the first and second detecting signals Tx1 and Tx2 may be the same as the detecting signal Tx of FIG. 19 or signals included in the detecting signal Tx of FIG. 19.

FIG. 28 is a cross-sectional view of a sensor, according to one or more exemplary embodiments. The sensor 100 of FIG. 28 is similar in structure and function as the sensor 100 of FIG. 19, and, as such, duplicative descriptions have been omitted to avoid obscuring exemplary embodiments described herein. In this manner, different features associated with the transmission of signals will be described below.

Referring to FIG. 28, the first sensor electrode SE1 receives the first detecting signal Tx1 in the first sensing period, and the second sensor electrode SE2 outputs the first sensing signal Rx1. The first variation value calculator 210 receives the first sensing signal Rx1 in the first sensing period. The third sensor electrode SE3 receives the second detecting signal Tx2 in the second sensing period, and the second sensor electrode SE2 outputs the second sensing signal Rx2. The second variation value calculator 220 receives the second sensing signal Rx2 in the second sensing period.

FIG. 29 is a cross-sectional view of a sensor, according to one or more exemplary embodiments. The sensor 100 of FIG. 29 is similar in structure and function as the sensor 100 of FIG. 19, and, as such, duplicative descriptions have been omitted to avoid obscuring exemplary embodiments described herein. In this manner, different features associated with the transmission of signals will be described below.

Referring to FIG. 29, the first to third sensor electrodes SE1 to SE3 respectively receive the first to third detecting signals Tx1 to Tx3 in the first sensing period. The first to third sensor electrodes SE1 to SE3 respectively generate the first to third sensing signals Rx1 to Rx3 formed via self-capacitance in response to the first to third detecting signals Tx1 to Tx3. The first to third sensor electrodes SE1 to SE3 respectively output the first to third sensing signals Rx1 to Rx3 in the second sensing period.

According to one or more exemplary embodiments, the first and second variation value calculators 210 and 220 receive the first to third sensing signals Rx1 to Rx3 in the second sensing period and generate the first and second variation values $\Delta C1$ and $\Delta C2$ on the basis of the first to third sensing signals Rx1 to Rx3. It is also contemplated that the first and second variation value calculators 210 and 220 may receive only two sensing signals among the first to third sensing signals Rx1 to Rx3 and generate the first and second variation values $\Delta C1$ and $\Delta C2$ on the basis of the two sensing signals.

Figure 30A:
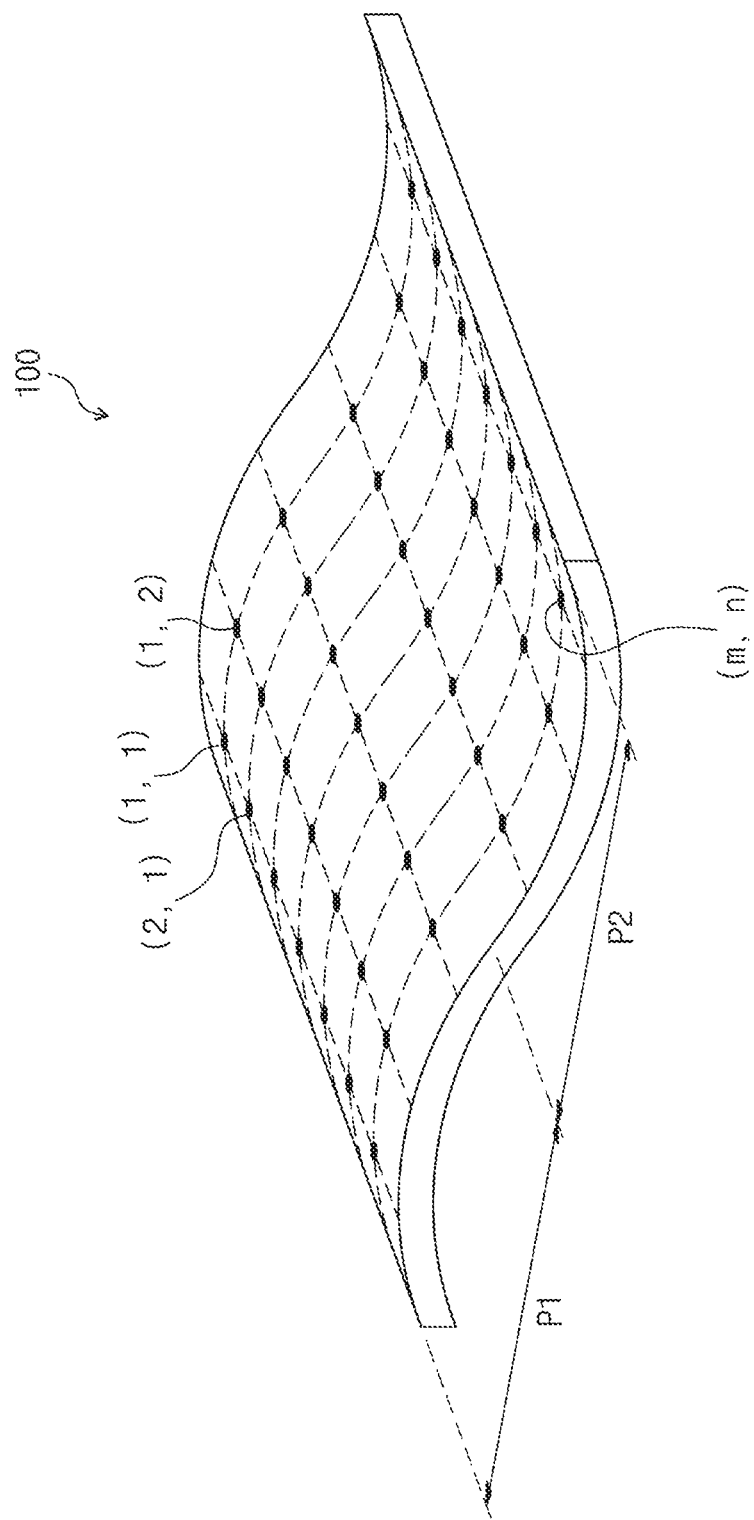
FIG. 30A is a perspective view of a sensor, according to one or more exemplary embodiments.
Figure 30B:
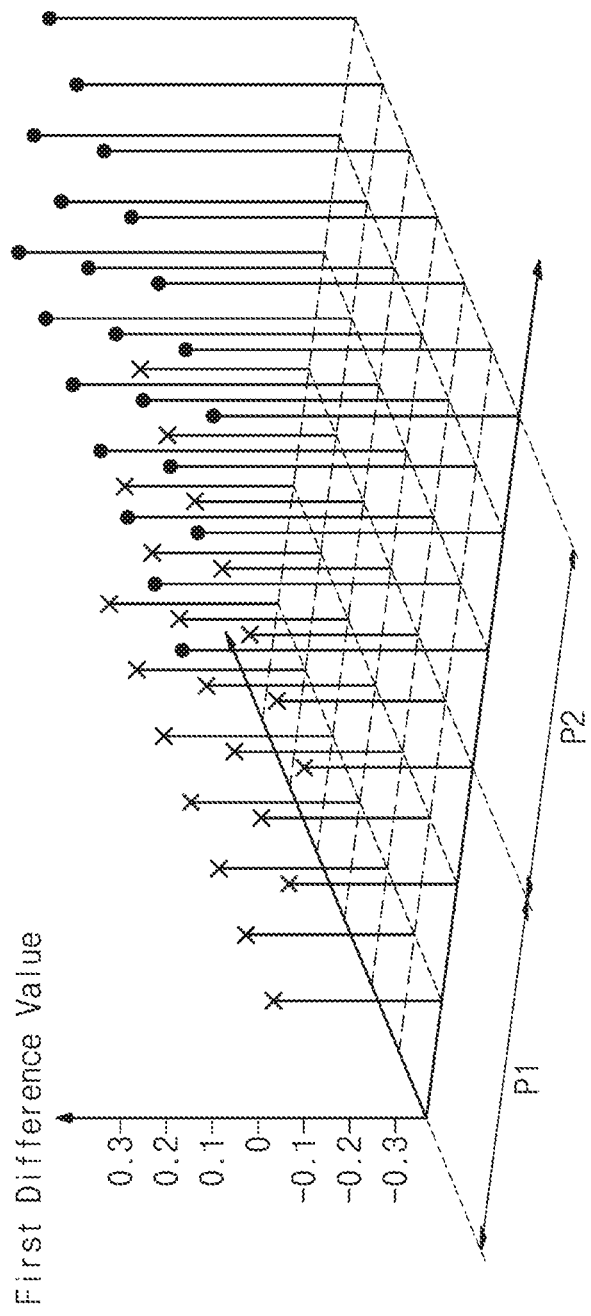
FIG. 30B is a view of deformation information generated on the basis of a sensing signal output from the sensor of FIG. 30A, according to one or more exemplary embodiments.
Figure 30C:
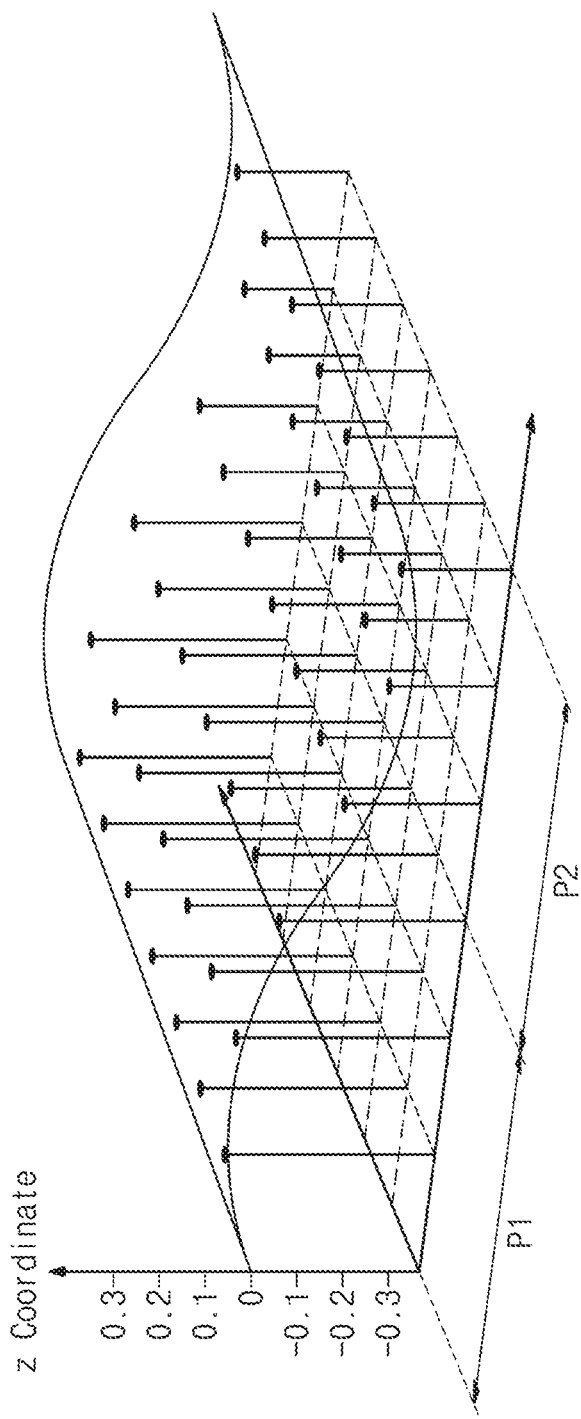
FIG. 30C is a view of three-dimensional spatial information of an electronic device that is generated based on the deformation information of FIG. 30B, according to one or more exemplary embodiments.

FIG. 30A is a perspective view of a sensor, according to one or more exemplary embodiments. FIG. 30B is a view of deformation information generated on the basis of a sensing signal output from the sensor of FIG. 30A, according to one or more exemplary embodiments. FIG. 30C is a view of three-dimensional spatial information of an electronic device that is generated based on the deformation information of FIG. 30B, according to one or more exemplary embodiments. For illustrative and descriptive convenience, the sensor of FIG. 21A is described with reference to sensor 100 of FIG. 1.

Referring to FIG. 30A, the sensor 100 has a shape curved by an external force applied thereto. For instance, a first portion P1 of the sensor 100 is convexly curved upward, and a second portion P2 of the sensor 100 is convexly curved downward. In one or more exemplary embodiments, the first and second variation value calculators 210 and 220 of FIG. 19 may respectively generate the first and second variation values $\Delta C1$ and $\Delta C2$ in accordance with coordinates defined on a plane surface of the sensor 100. For instance, the first and second variation value calculators 210 and 220 may respectively generate the first and second variation values $\Delta C1$ and $\Delta C2$ at the (m, n) coordinates of the sensor 100 using the (m, n)-th first and second capacitances $C1_{mn}$ and $C2_{mn}$ described with reference to FIG. 2.

As shown in FIG. 30B, since the first portion P1 is convexly curved upward, the first difference value with respect to the first portion P1 may have a negative number. The first difference value with respect to the second portion P2 may have a positive number since the second portion P2 is convexly curved downward. The variation value comparator 230 may generate the first difference value of the coordinates as the deformation values shown in FIG. 30B. Referring to FIG. 30B, the first difference values corresponding to the first portion P1 have negative numbers, and the first difference values corresponding to the second portion P2 have positive numbers.

Referring to FIG. 30C, the sensing processor 240 generates the three-dimensional spatial information of the sensor 100 on the basis of the first difference values calculated for the coordinates, and, as such, the shape of the sensor 100 curved by the external force may be determined. The three-dimensional spatial information may also include information on a position (z-coordinate) in the third direction DR3 for the coordinates of the sensor 100.

Figure 31A:
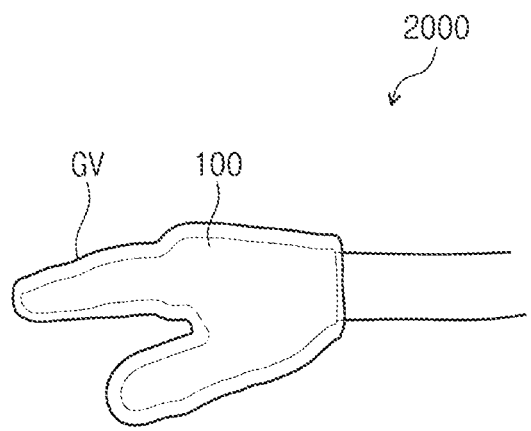
FIGS. 31A, 31B, and 31C are views of an operation of an electronic device, according to one or more exemplary embodiments.
Figure 31B:
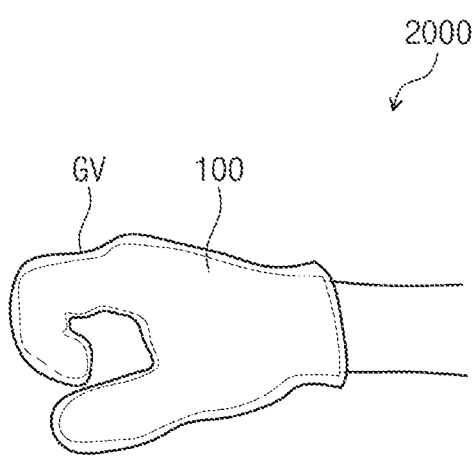
Figure 31C:
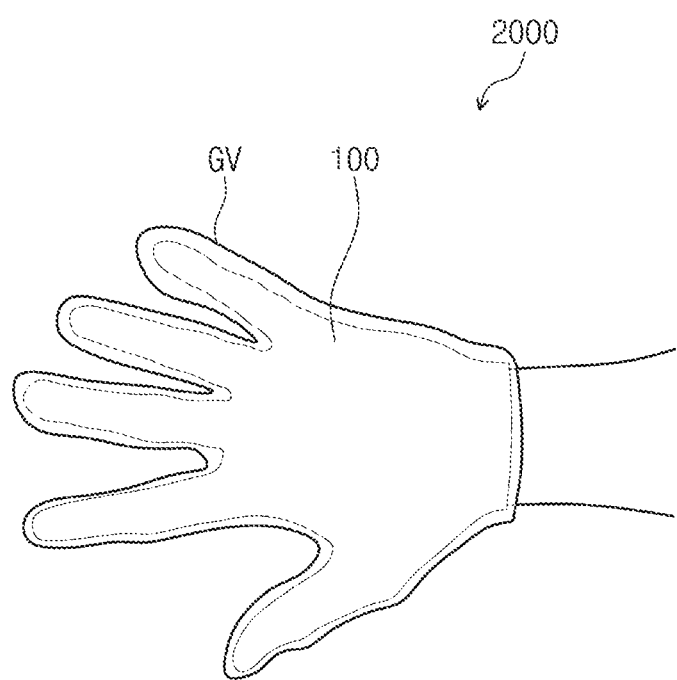

FIGS. 31A, 31B, and 31C are views of an operation of an electronic device, according to one or more exemplary embodiments.

Referring to FIG. 31A, an electronic device 2000 may be, but is not limited to, an electronic glove 2000, e.g., a wearable electronic clothing. The electronic glove 2000 includes a glove GV and the sensor 100 disposed inside the glove GV. It is contemplated, however, that the sensor 100 may be disposed outside the glove, outside and inside the glove, or otherwise incorporated as part of the glove. In this manner, the sensor 100 may be used as an input device, such as an input device to another electronic device, e.g., appliance, computer, gaming console, robotic manipulator, sign, vehicle, etc. The sensor 100 may be entirely disposed over the glove GV or may be disposed at a certain area and areas adjacent to the certain area to obtain the three-dimensional spatial information of the certain area (e.g., fingers).

According to one or more exemplary embodiments, when the user puts on the electronic glove 2000 and moves in a variety of ways, such as shown in FIGS. 31A to 31C, the sensor 100 receives the sensing signals corresponding to the user's actions, and the electronic glove 2000 calculates the three-dimensional spatial information of the sensor 100 on the basis of the sensing signals and uses the three-dimensional spatial information as input information. The electronic glove 2000 controls other components of the electronic glove 2000 using the three-dimensional spatial information or transmits the three-dimensional spatial information to other components through a communication unit as a control signal to control other components.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An electronic device comprising:
   a sensor comprising:
      a first sensor electrode configured to output a first sensing signal;
      a second sensor electrode configured to receive a detection signal and defining a single unibody electrode, the single unibody electrode comprising a first surface, a second surface opposing the first surface in a direction, and a third surface connecting the first surface and the second surface, the second sensor electrode being disposed on the first sensor electrode such that the first surface faces the first sensor electrode in the direction; and
      a third sensor electrode configured to output a second sensing signal and disposed on the second sensor electrode such that the second surface faces the third sensor electrode in the direction; and
   at least one processor configured to:
      determine a first variation in value of a first capacitance formed between the first sensor electrode and the first surface of the second sensor electrode as a first variation value, the first variation value corresponding to a change in distance between the first sensor electrode and the first surface of the second sensor electrode;
      determine a second variation in value of a second capacitance formed between the second surface of the second sensor electrode and the third sensor electrode as a second variation value, the second variation value corresponding to a change in distance between the second surface of the second sensor electrode and the third sensor electrode;
      determine a mechanical deformation of the sensor in at least the direction based on the first variation value and the second variation value;
      determine a comparison value based on a comparison of the first variation value and the second variation value;
      determine the mechanical deformation of the sensor based further on the comparison value;
      initiate a curve sensing mode in response to a determination that the first variation value and the second variation value are positive numbers; and
      determine, in the curve sensing mode, whether the sensor is convexly curved upward or convexly curved downward based on the comparison value.

2. The electronic device of claim 1, wherein the at least one processor is further configured to:
   determine a curvature of the sensor based on the comparison value.

3. The electronic device of claim 1, wherein the at least one processor is further configured to:
   initiate a pressure sensing mode in response to a determination that one variation value among the first variation value and the second variation value is substantially zero and the other variation value among the first variation value and the second variation value is a positive number;
   determine, in the pressure sensing mode, a pressure applied to the sensor based on the other variation value.

4. The electronic device of claim 3, wherein the at least one processor is further configured to:
   determine, in the pressure sensing mode, a direction in which the pressure is applied to the sensor based on the comparison value.

5. The electronic device of claim 1, wherein the at least one processor is further configured to:
   initiate a stretch sensing mode in response to a determination that the first variation value is positive and equivalent to the second variation value; and
   determine, in the stretch sensing mode, a strain of the sensor based on the comparison value.

6. The electronic device of claim 1, wherein the at least one processor is further configured to:
   sense a touch event based on the first variation value and the second variation value.

7. The electronic device of claim 1, wherein the at least one processor is further configured to:
   initiate a touch sensing mode in response to the first variation value and the second variation value being negative numbers; and
   determine, in the touch sensing mode, whether the touch event is associated with the first sensor electrode or the third sensor electrode based on the comparison value.

8. The electronic device of claim 1, wherein the at least one processor is further configured to:
   apply the detection signal to the second sensor electrode;
   receive the first sensing signal from the first sensor electrode the determination of the first variation value being based on the first sensing signal;
   receive the second sensing signal from the third sensor electrode, the determination of the second variation value being based on the second sensing signal.

9. The electronic device of claim 8, wherein:
   reception of the first sensing signal is in accordance with a first sensing period;
   reception of the second sensing signal is in accordance with a second sensing period; and
   the second sensing period does not temporally overlap with the first sensing period.

10. The electronic device of claim 9, wherein:
    the detection signal comprises a first detection signal and a second detection signal; and
    the at least one processor is configured to:
       apply the first detection signal to the second sensor electrode in accordance with the first sensing period; and
       apply the second detection signal to the second sensor electrode in accordance with the second sensing period.

11. The electronic device of claim 1, wherein:
    the determination of the first variation value is in accordance with a first coordinate;
    the determination of the second variation value is in accordance with a second coordinate; and
    the at least one processor is further configured to:
       determine a first deformation value with respect to the first coordinate based on the first variation value; and
       determine a second deformation value with respect to the second coordinate based on the second variation value.

12. The electronic device of claim 11, wherein the at least one processor is further configured to:
  determine three-dimensional information with respect to the first sensor electrode, the second sensor electrode, and the third sensor electrode based on the first deformation value and the second deformation value.

13. A method comprising:
  determining a first variation in capacitance with respect to a first capacitor formed in association with a first surface of a first sensing electrode of an electronic device, the first sensing electrode defining a single unibody electrode;
  determining a second variation in capacitance with respect to a second capacitor formed in association with a second surface of the first sensing electrode, the second surface opposing the first surface; and
  determining a mode of user interaction with the electronic device among modes of user interaction based on the first variation, the second variation, and a comparison of the first variation and the second variation,
  wherein:
  the modes of user interaction comprise a curve sensing mode, a pressure sensing mode, a stretch sensing mode, and a touch sensing mode;
  the first sensing electrode is configured to receive a detection signal;
  the curve sensing mode is determined to be an arcuate bending of the electronic device in response to the first variation and the second variation being positive;
  the pressure sensing mode is determined to be a pressing of the electronic device in a first direction in response to one of the first variation and the second variation being positive and another one of the first variation and the second variation being substantially zero;
  the touch sensing mode is determined to be a touch event associated with the electronic device in response to the first variation and the second variation being negative; and
  the stretch sensing mode is determined to be a stretching or compressing of the electronic device in a second direction different from the first direction in response to the first variation and the second variation being in a same direction and a difference between the first variation and the second variation being substantially zero.

* * * * *